US011758733B2

(12) United States Patent
Huang et al.

(10) Patent No.: US 11,758,733 B2
(45) Date of Patent: Sep. 12, 2023

(54) 3D MEMORY MULTI-STACK CONNECTION METHOD

(71) Applicant: Taiwan Semiconductor Manufacturing Company, Ltd., Hsinchu (TW)

(72) Inventors: Chia-En Huang, Xinfeng Township (TW); Meng-Han Lin, Hsinchu (TW); Ya-Hui Wu, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 78 days.

(21) Appl. No.: 17/245,142

(22) Filed: Apr. 30, 2021

(65) Prior Publication Data
US 2022/0352207 A1 Nov. 3, 2022

(51) Int. Cl.
*H10B 51/20* (2023.01)
*H10B 51/10* (2023.01)
*H10B 51/30* (2023.01)
*H01L 29/417* (2006.01)

(52) U.S. Cl.
CPC ....... *H10B 51/20* (2023.02); *H01L 29/41741* (2013.01); *H01L 29/41775* (2013.01); *H10B 51/10* (2023.02); *H10B 51/30* (2023.02)

(58) Field of Classification Search
CPC ............. H01L 23/528; H01L 29/41741; H01L 29/41775; H10B 51/10; H10B 51/20; H10B 51/30
See application file for complete search history.

(56) References Cited

U.S. PATENT DOCUMENTS

| | | | |
|---|---|---|---|
| 2020/0026990 A1* | 1/2020 | Lue | G06N 3/063 |
| 2022/0037362 A1* | 2/2022 | Lin | H01L 29/41775 |

* cited by examiner

*Primary Examiner* — Matthew E Warren
(74) *Attorney, Agent, or Firm* — FOLEY & LARDNER LLP

(57) ABSTRACT

In some aspects of the present disclosure, a memory device includes a first memory array including: a plurality of memory strings spaced from each other along a first lateral direction and a second lateral direction, each of the plurality of memory strings including a plurality of memory cells arranged along a vertical direction; and a plurality of first conductive structures extending along the vertical direction; wherein each of the plurality of first conductive structures includes a first portion and a second portion; wherein the first portion extends across the plurality of memory cells of a corresponding pair of the plurality of memory strings along the vertical direction, and the second portion is disposed over the first portion along the vertical direction; and wherein the second portion extends farther than the first portion along at least one of the first or second lateral direction.

20 Claims, 17 Drawing Sheets

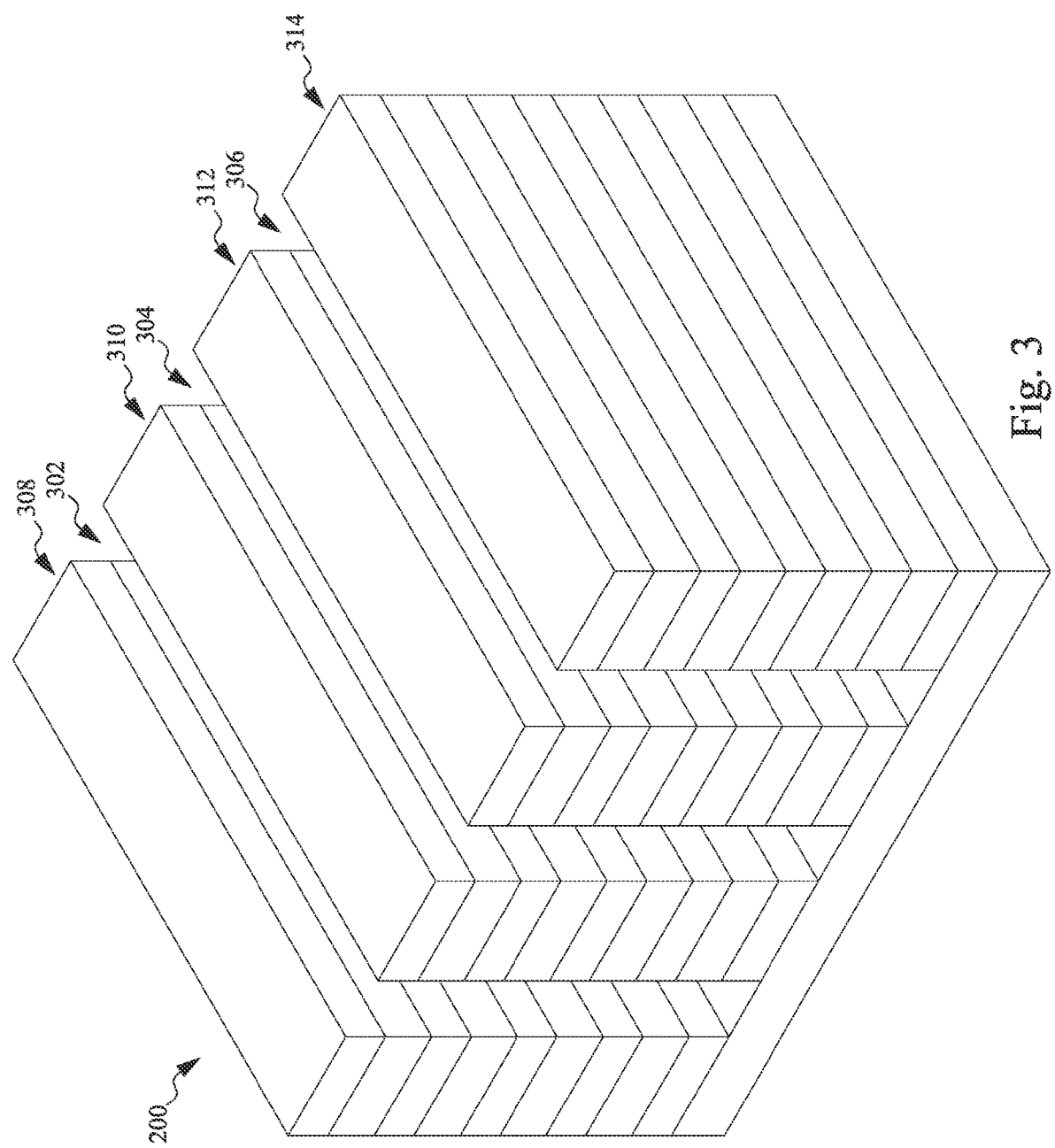
Fig. 3
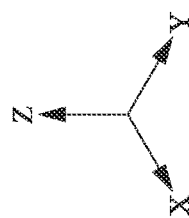

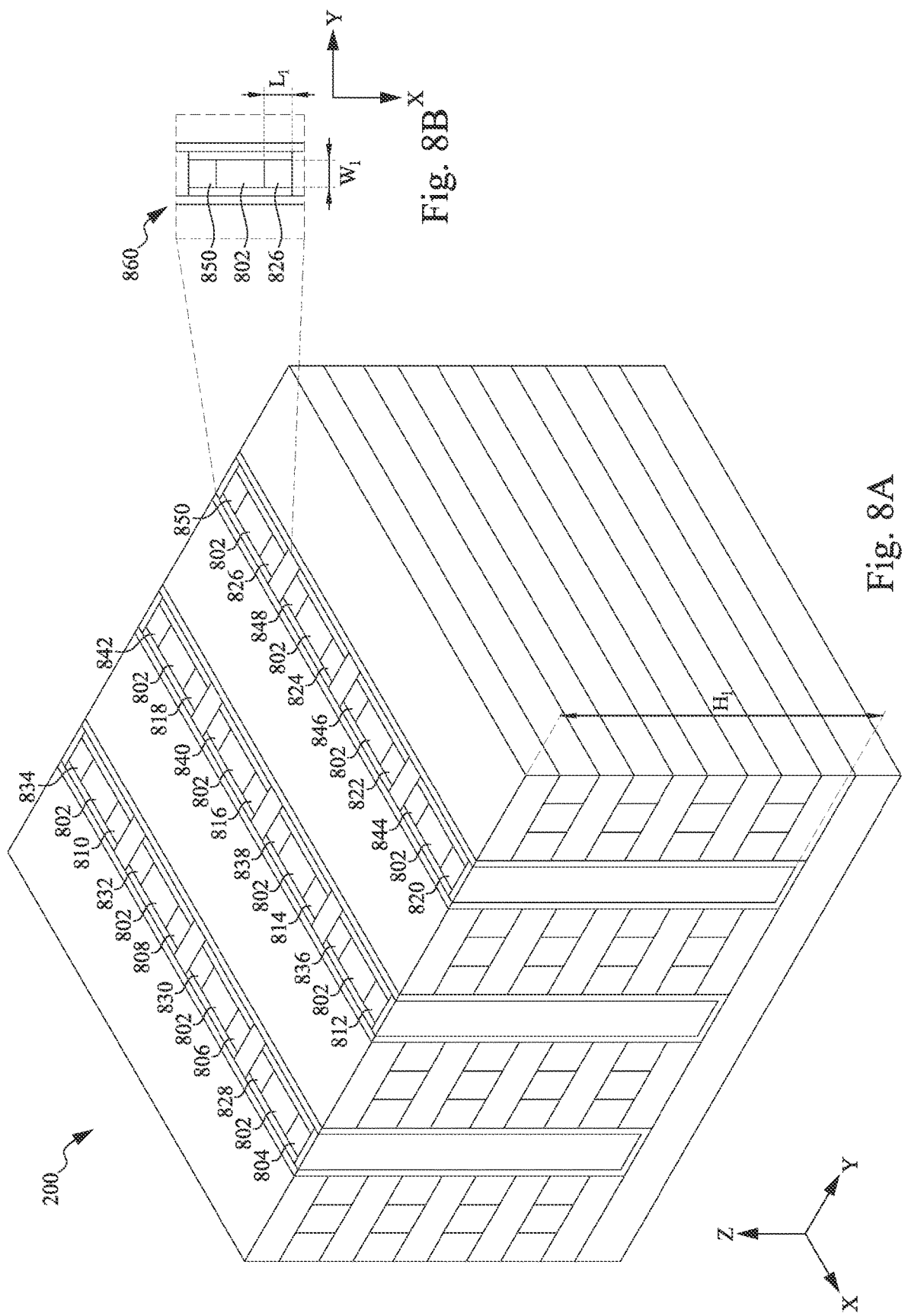

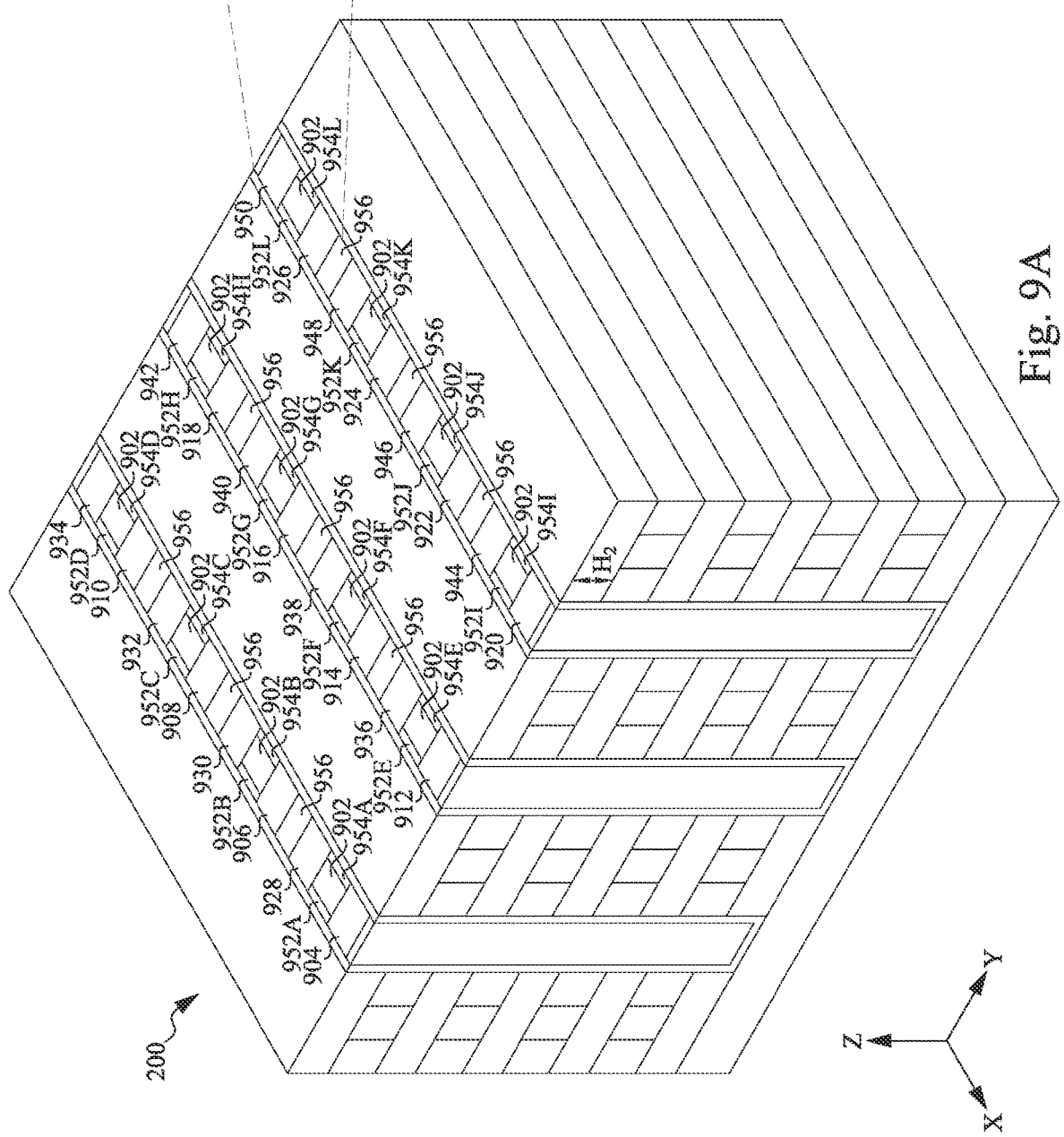

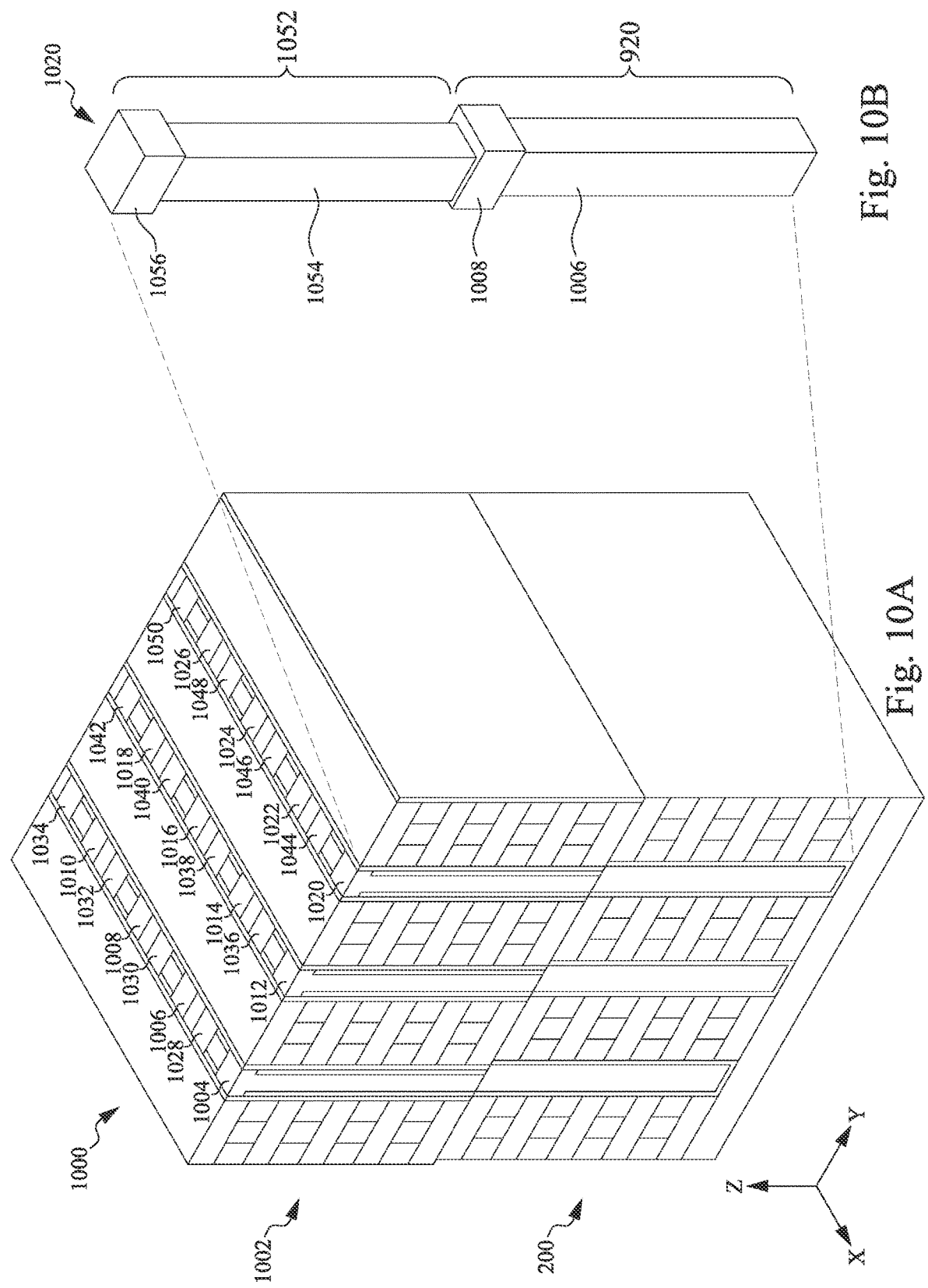

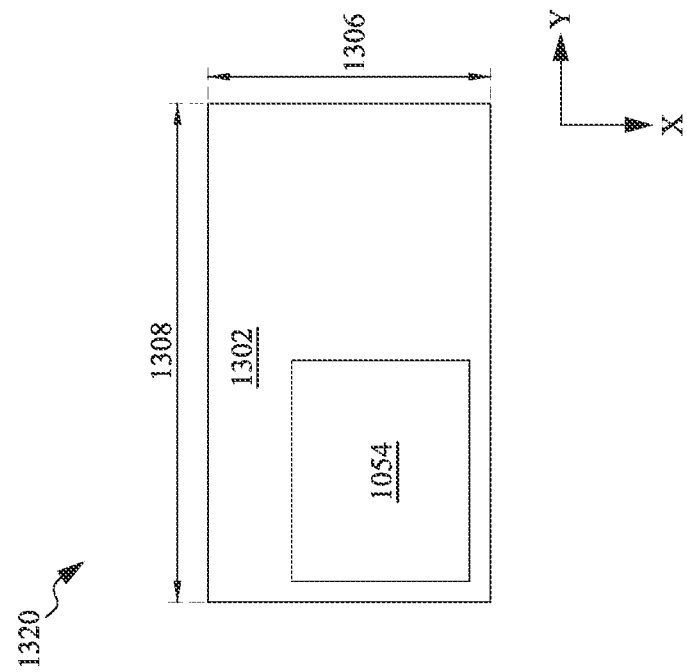
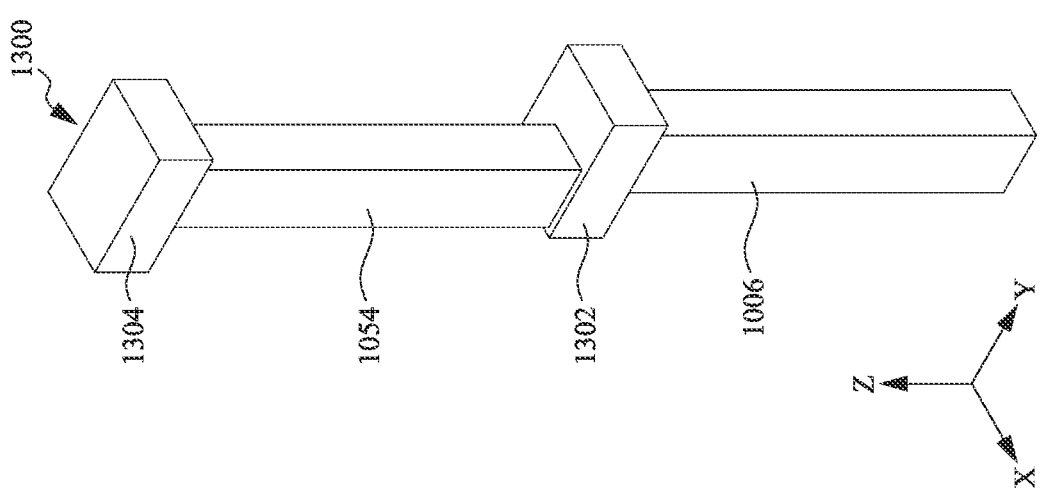

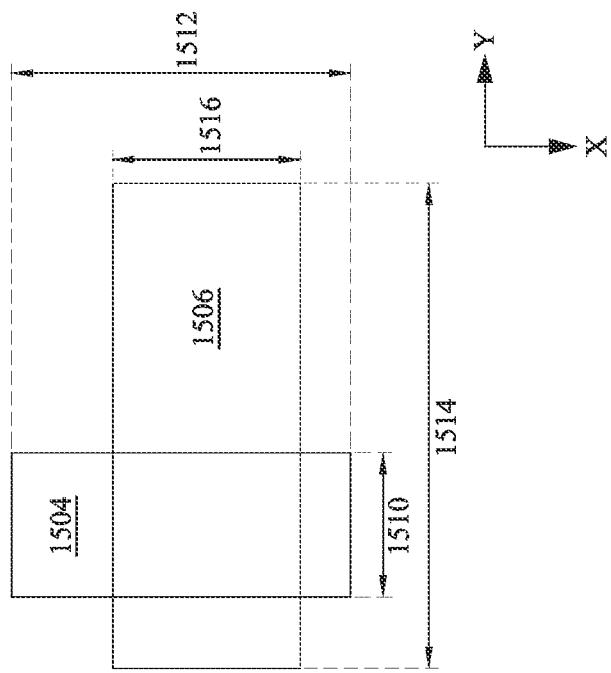
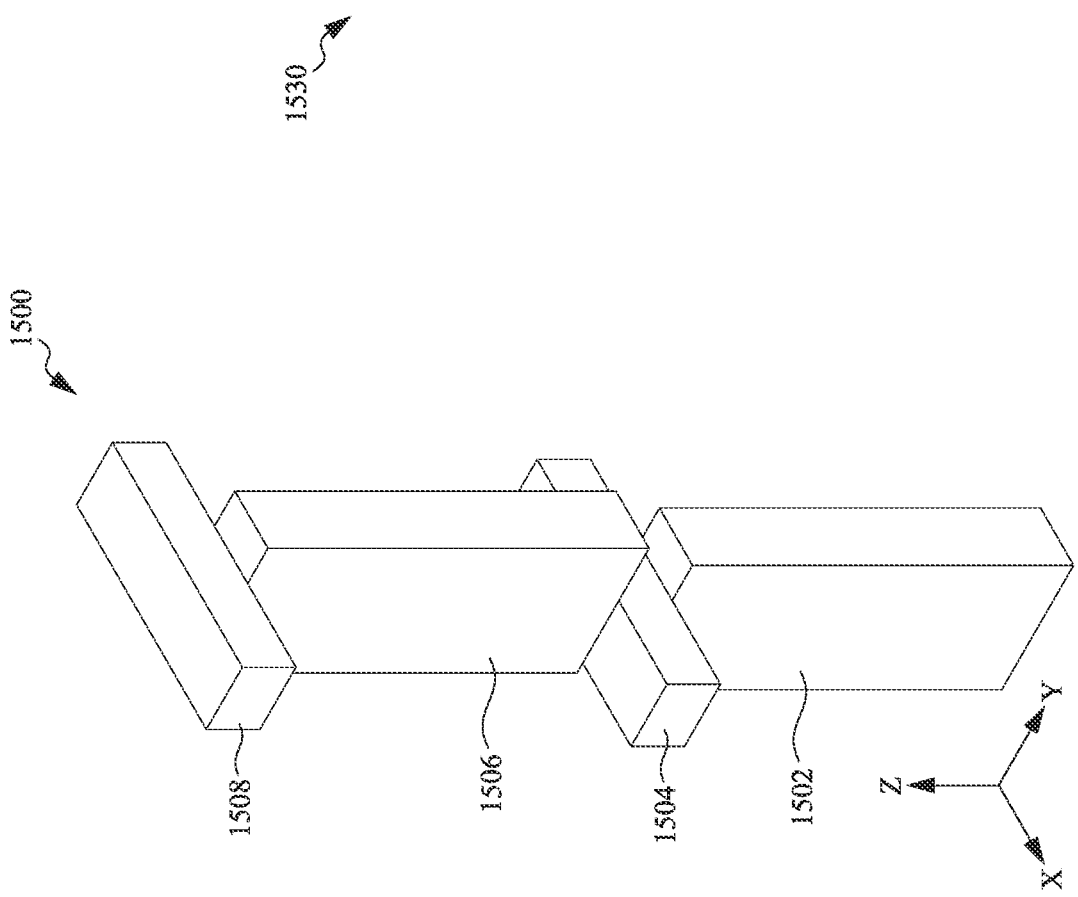

3D MEMORY MULTI-STACK CONNECTION METHOD

BACKGROUND

Developments in electronic devices, such as computers, portable devices, smart phones, internet of thing (IoT) devices, etc., have prompted increased demands for memory devices. In general, memory devices may be volatile memory devices and non-volatile memory devices. Volatile memory devices can store data while power is provided but may lose the stored data once the power is shut off. Unlike volatile memory devices, non-volatile memory devices may retain data even after the power is shut off but may be slower than the volatile memory devices.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 2, 3, 4, 5, 6, 7, 8A, 8B, 9A, 9B, 10A, and 10B each illustrates a perspective or top view of an example three-dimensional memory device during various fabrication stages, made by the method of FIG. 1, in accordance with some embodiments.

FIGS. 11A, 11B, 12A, 12B, 13A, 13B, 14A, 14B, 15A, 15B, 16A, and 16B illustrate perspective views and top views of various configurations of the multi-device BLs and SLs shown in FIGS. 10A-10B.

DETAILED DESCRIPTION

Figure 1:
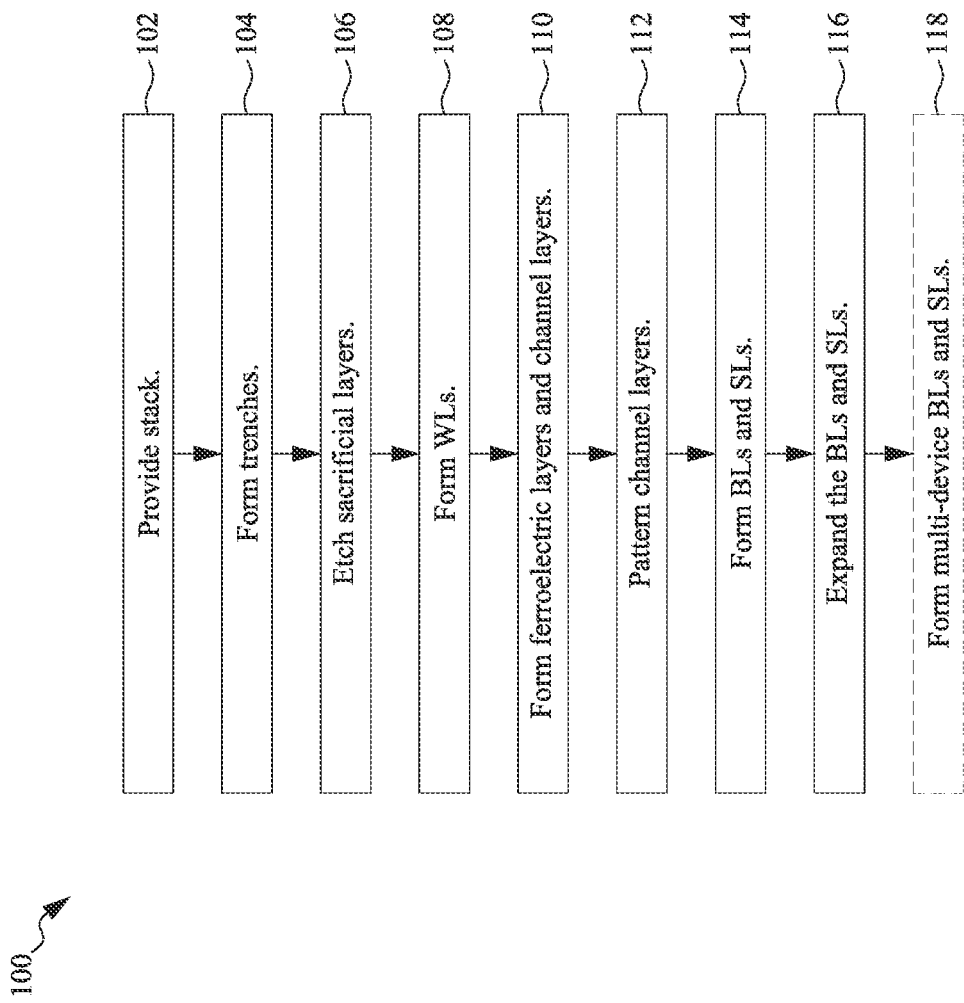
FIG. 1 illustrates a flow chart of an example method for making a three-dimensional memory device, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The present disclosure provides various embodiments of a three-dimensional (3D) memory system, and methods of forming the same. The 3D memory system, as disclosed herein, includes a number of memory cells formed as a memory array. The memory cells are formed across multiple memory levels (or tiers) over a substrate. Each of the memory cells is implemented as a ferroelectric memory cell. For example, each ferroelectric memory cell can be constituted by at least one of: a portion of a semiconductor channel layer that continuously extends along a vertical direction of the array, a portion of a ferroelectric layer that also continuously extends along the vertical direction of the array, one of a number of first conductive structures (functioning as its gate electrode) that continuously extends along a lateral direction of the array, a second conductive structure (functioning as its source electrode) that continuously extends along the vertical lateral direction of the array, and a third conductive structure (functioning as its drain electrode) that continuously extends along the vertical lateral direction of the array. The gate electrodes, drain electrodes, and source electrodes may sometimes be referred to as "word line (WL)," "bit line (BL)," and "source/select line (SL)," respectively.

In accordance with some embodiments, a 3D memory system includes a plurality of memory cells. An exemplary memory cell includes a first enlarged, nail-like drain/source structure (e.g., BL) and a second enlarged, nail-like drain/source structure (e.g., SL) spaced from the first enlarged, nail-like drain/source structure in one of a first or second lateral direction. In some embodiments, each enlarged, nail-like drain/source structure includes a top portion disposed over a bottom portion, wherein the top portion extends farther in first and second lateral directions than the bottom portion. The memory cell includes a ferroelectric layer coupled to at least a first sidewall of each of the first drain/source structure, the second drain/source structure, and the third drain/source structure.

Advantageously, the 3D memory system employing the disclosed memory cell can achieve several benefits. In one aspect, the 3D memory system can enable a multiple-stack (e.g., multiple-3D memory device) process, such as for high-density applications that can save chip area, without a degradation in performance in case of lithography misalignment of the multiple-stack deposition. In one aspect, the 3D memory system can improve/reduce SL and BL contact resistance, particularly in case of the lithography misalignment, between a bottom device in the multiple-stack process and a top device in the multiple-stack process, wherein the top device is disposed over the bottom device. In one aspect, by improving the SL and BL contact resistance, the 3D memory system can improve/increase read current and read speed.

In general, a ferroelectric memory device (sometimes referred to as a "ferroelectric random access memory (FeRAM)" device) contains a ferroelectric material to store information. The ferroelectric material acts as the memory material of the memory device. The dipole moment of the ferroelectric material is programmed in two different orientations (e.g., "up" or "down" polarization positions based on oxygen atom position in the crystal lattice) depending on the polarity of the applied electric field to the ferroelectric material to store information in the ferroelectric material.

The different orientations of the dipole moment of the ferroelectric material can be detected by the electric field generated by the dipole moment of the ferroelectric material. For example, the orientation of the dipole moment can be detected by measuring electrical current passing through a semiconductor channel provided adjacent to the ferroelectric material. Although the following discussed embodiments of the disclosed 3D memory device are directed to a ferroelectric memory device, it should be appreciated that some of the embodiments may be used in any of various other types of 3D non-volatile memory devices (e.g., magnetoresistive random access memory (MRAM) devices, phase-change random access memory (PCRAM) devices, etc.), while remaining within the scope of the present disclosure.

FIG. 1 illustrates a flowchart of a method 100 to form a 3D memory device, according to one or more embodiments of the present disclosure. For example, at least some of the operations (or steps) of the method 100 can be used to form a ferroelectric 3D memory device and/or a stack of multiple 3D memory devices. It is noted that the method 100 is merely an example and is not intended to limit the present disclosure. Accordingly, it is understood that additional operations may be provided before, during, and after the method 100 of FIG. 1, and that some other operations may only be briefly described herein. In some embodiments, operations of the method 100 may be associated with perspective and/or top views of an example 3D memory device at various fabrication stages as shown in FIGS. 2, 3, 4, 5, 6, 7, 8A, 8B, 9A, 9B, 10A, and 10B, respectively, which will be discussed in further detail below.

In brief overview, the method 100 starts with operation 102 of providing a stack of insulating layers and sacrificial layers over a substrate. The method 100 continues to operation 104 of forming a number of trenches. The method 100 continues to operation 106 of etching sacrificial layers. The method 100 continues to operation 108 of forming a number of WLs. The method 100 continues to operation 110 of forming a number of ferroelectric layers and a number of channel layers. The method 100 continues to operation 112 of patterning the channel layers to form a number of channel segments. The method 100 continues to operation 114 of forming a number of bit lines and a number of source/select lines. The method 100 continues to operation 116 of expanding the bit lines and source/select lines. In some embodiments, the method 100 continues to operation 118 of forming multi-device (e.g., multi-stack) BLs and SLs.

Figure 2:
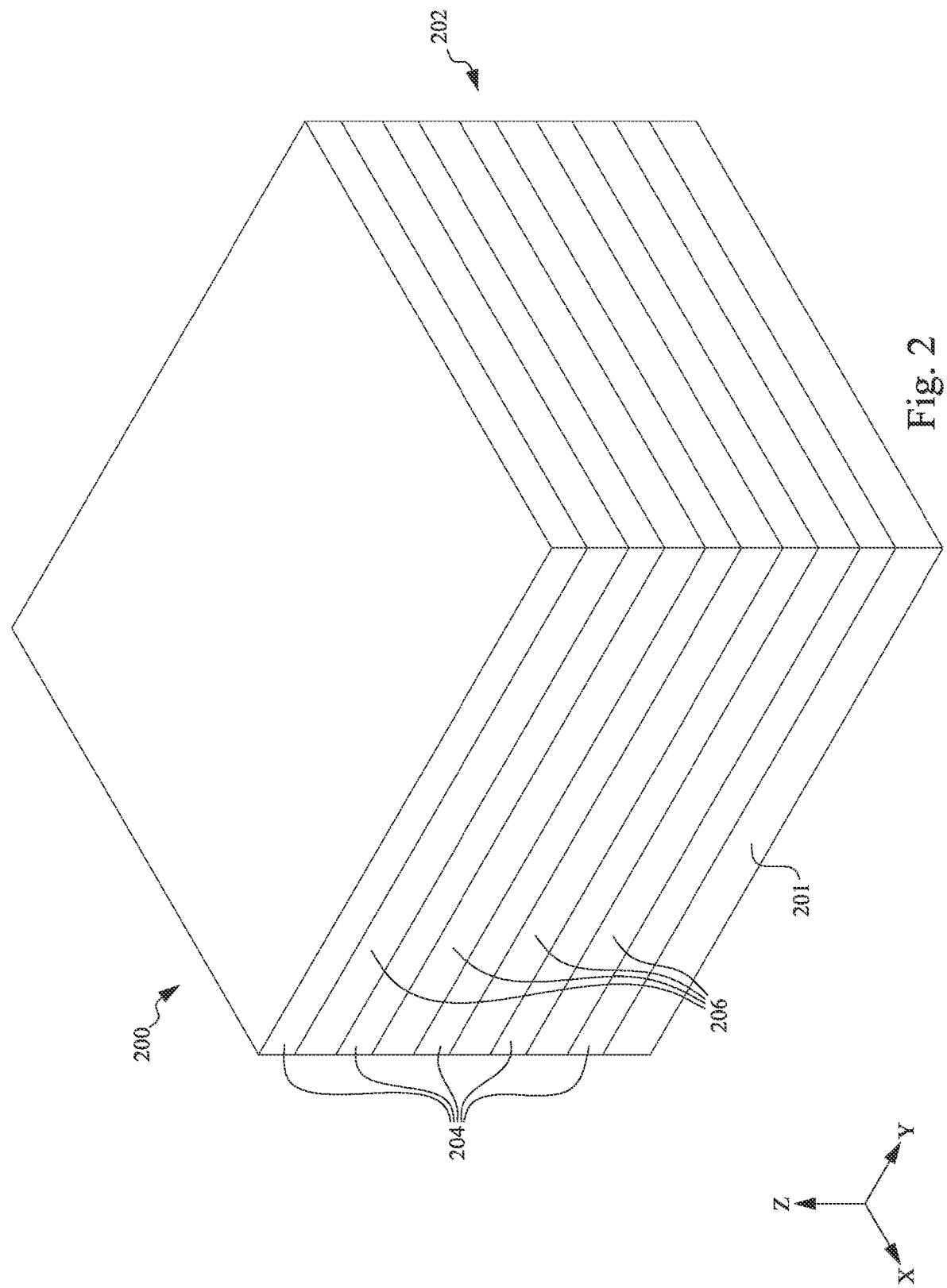

Corresponding to operation 102 of FIG. 1, FIG. 2 is a perspective view of the 3D memory device 200 including a stack 202 formed over a semiconductor substrate 201 at one of the various stages of fabrication, in accordance with various embodiments.

The substrate 201 may be a semiconductor substrate, such as a bulk semiconductor, a semiconductor-on-insulator (SOI) substrate, or the like, which may be doped (e.g., with a p-type or an n-type dopant) or undoped. The substrate 201 may be a wafer, such as a silicon wafer. Generally, an SOI substrate includes a layer of a semiconductor material formed on an insulator layer. The insulator layer may be, for example, a buried oxide (BOX) layer, a silicon oxide layer, or the like. The insulator layer is provided on a substrate, typically a silicon or glass substrate. Other substrates, such as a multi-layered or gradient substrate may also be used. In some embodiments, the semiconductor material of the substrate 201 may include silicon; germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. Other materials are within the scope of the present disclosure.

The stack 202 includes a number of insulating layers 204 and a number of sacrificial layers 206 alternately stacked on top of one another over the substrate 201 along a vertical direction (e.g., the Z direction). Although five insulating layers 204 and four sacrificial layers 206 are shown in the illustrated embodiment of FIG. 2, it should be understood that the stack 202 can include any number of insulating layers and any number of sacrificial layers alternately disposed on top of one another, while remaining within the scope of the present disclosure. Further, although the stack 202 directly contacts the substrate 201 in the illustrated embodiment of FIG. 2, it should be understood that the stack 202 is separated from the substrate 201 (as mentioned above). For example, a number of (planar and/or non-planar) transistors may be formed over the substrate 201, and a number of metallization layers, each of which includes a number of contacts electrically connecting to those transistors, may be formed between the substrate 201 and the stack 202. As used herein, the alternately stacked insulating layers 204 and sacrificial layers 206 refer to each of the sacrificial layers 206 being adjoined by two adjacent insulating layers 204. The insulating layers 204 may have the same thickness thereamongst or may have different thicknesses. The sacrificial layers 206 may have the same thickness thereamongst or may have different thicknesses. In some embodiments, the stack 202 may begin with the insulating layer 204 (as shown in FIG. 2) or the sacrificial layer 206.

The insulating layers 204 can include at least one insulating material. The insulating materials that can be employed for the insulating layer 204 include, but are not limited to, silicon oxide (including doped or undoped silicate glass), silicon nitride, silicon oxynitride, organosilicate glass (OSG), spin-on dielectric materials, dielectric metal oxides that are generally known as high dielectric constant (high-k) dielectric oxides (e.g., aluminum oxide, hafnium oxide, etc.) and silicates thereof, dielectric metal oxynitrides and silicates thereof, and organic insulating materials. In one embodiment, the insulating layers 204 can be silicon oxide. Other materials are within the scope of the present disclosure.

The sacrificial layers 206 may include an insulating material, a semiconductor material, or a conductive material. The material of the sacrificial layers 206 is a sacrificial material that can be subsequently removed selective to the material of the insulating layers 204. Non-limiting examples of the sacrificial layers 206 include silicon nitride, an amorphous semiconductor material (such as amorphous silicon), and a polycrystalline semiconductor material (such as polysilicon). In one embodiment, the sacrificial layers 206 can be spacer material layers that include silicon nitride or a semiconductor material including at least one of silicon or germanium. Other materials are within the scope of the present disclosure.

The stack 202 can be formed by alternately depositing the respective materials of the insulating layers 204 and sacrificial layers 206 over the substrate 201. In some embodiments, one of the insulating layers 204 can be deposited, for example, by chemical vapor deposition (CVD), followed by depositing, for example, using CVD or atomic layer deposition (ALD), one of the sacrificial layers 206. Other methods of forming the stack 202 are within the scope of the present disclosure.

Corresponding to operation 104 of FIG. 1, FIG. 3 is a perspective view of the 3D memory device 200 in which the stack 202 is patterned to form trenches 302, 304, and 306 at one of the various stages of fabrication, in accordance with various embodiments. Although three trenches 302-306 are shown in the illustrated embodiment of FIG. 3, it should be understood that the 3D memory device 200 can include any number of trenches, while remaining within the scope of the present disclosure.

The trenches 302-306 all extend along a lateral direction (e.g., the X direction). The trenches 302-306 can be formed by performing at least some of the following processes: forming a blanket mask layer over the stack 202; patterning the blanket mask layer to form a number of openings (or windows); and, with the patterned mask layer covering a number of portions of the stack 202, etching the stack 202 using a first etching process.

The first etching process may include, for example, a reactive ion etching (RIE) process, a neutral beam etching (NBE) process, the like, or combinations thereof. The first etching process may be anisotropic. As such, the trenches 302-306, vertically extending through the stack 202, can be formed. For example, the trenches 302-306 (after the first etching process) may have nearly vertical sidewalls, each of which is collectively constituted by respective etched sidewalls of the insulating layers 204 and sacrificial layers 206. In some embodiments, the trenches 302-306 may be strips (when viewed from the top) parallel to each other, and closely spaced with respect to each other (by the remaining portions of the stack 202). Other methods of etching the stack 202 and forming the trenches 302-306 are within the scope of the present disclosure.

As a result of forming the trenches 302-306, fin-like structures 308, 310, 312, and 314 are formed at one of the various stages of fabrication, in accordance with various embodiments. As shown, the fin-like structures 308-314 (e.g., stripe structures) all extend along a lateral direction (e.g., the X direction), and are in parallel with one another. Each of the fin-like structures 308-314 includes a number of layers (or tiers) alternately stacked on top of one another. In particular, at one of the various fabrication stages corresponding to operation 104, each of the fin-like structures 308-314 includes an alternate stack of a number of the insulating layers 204 and a number of the sacrificial layers 206, in some embodiments.

Figure 4:
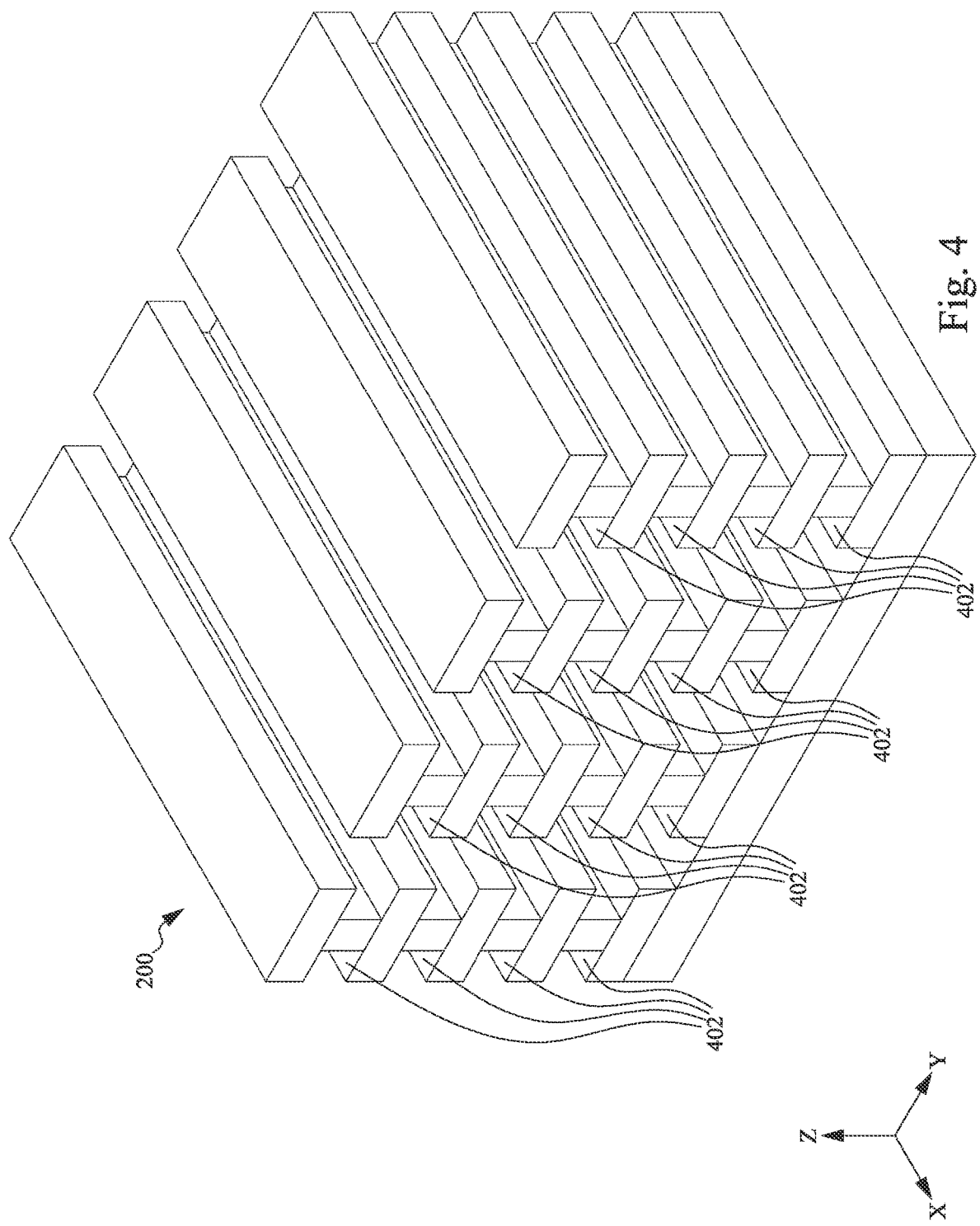

Corresponding to operation 106 of FIG. 1, FIG. 4 is a perspective view of the 3D memory device 200 in which the sacrificial layers 206 are etched at one of the various stages of fabrication, in accordance with various embodiments.

Each of the sacrificial layers 206 may be recessed to laterally (e.g., along the Y direction) to extend the trenches 302-306, e.g., to form recesses in the fin-like structures 308-314 which inwardly extend toward the remaining portions of the sacrificial layers 206. The sacrificial layers 206 can be recessed by performing a second etching process that etches the sacrificial layers 206 selective to the insulating layers 204 through the trenches 302-306. Alternatively stated, the insulating layers 204 may remain substantially intact throughout the second etching process. As such, the trenches 302-306 (after the second etching process) can each include its inner sidewalls present in a step-like profile.

The second etching process can include a wet etching process employing a wet etch solution or can be a gas phase (dry) etching process in which the etchant is introduced in a vapor phase into the first trenches (dotted lines). In the example where the sacrificial layers 206 include silicon nitride and the insulating layers 204 include silicon oxide, the second etching process can include a wet etching process in which the workpiece is immersed within a wet etch tank that includes phosphoric acid, which etches silicon nitride of the sacrificial layer 206 selective to silicon oxide, silicon, and various other materials of the insulating layers 204. Other methods of etching the sacrificial layer 206 are within the scope of the present disclosure.

Figure 5:
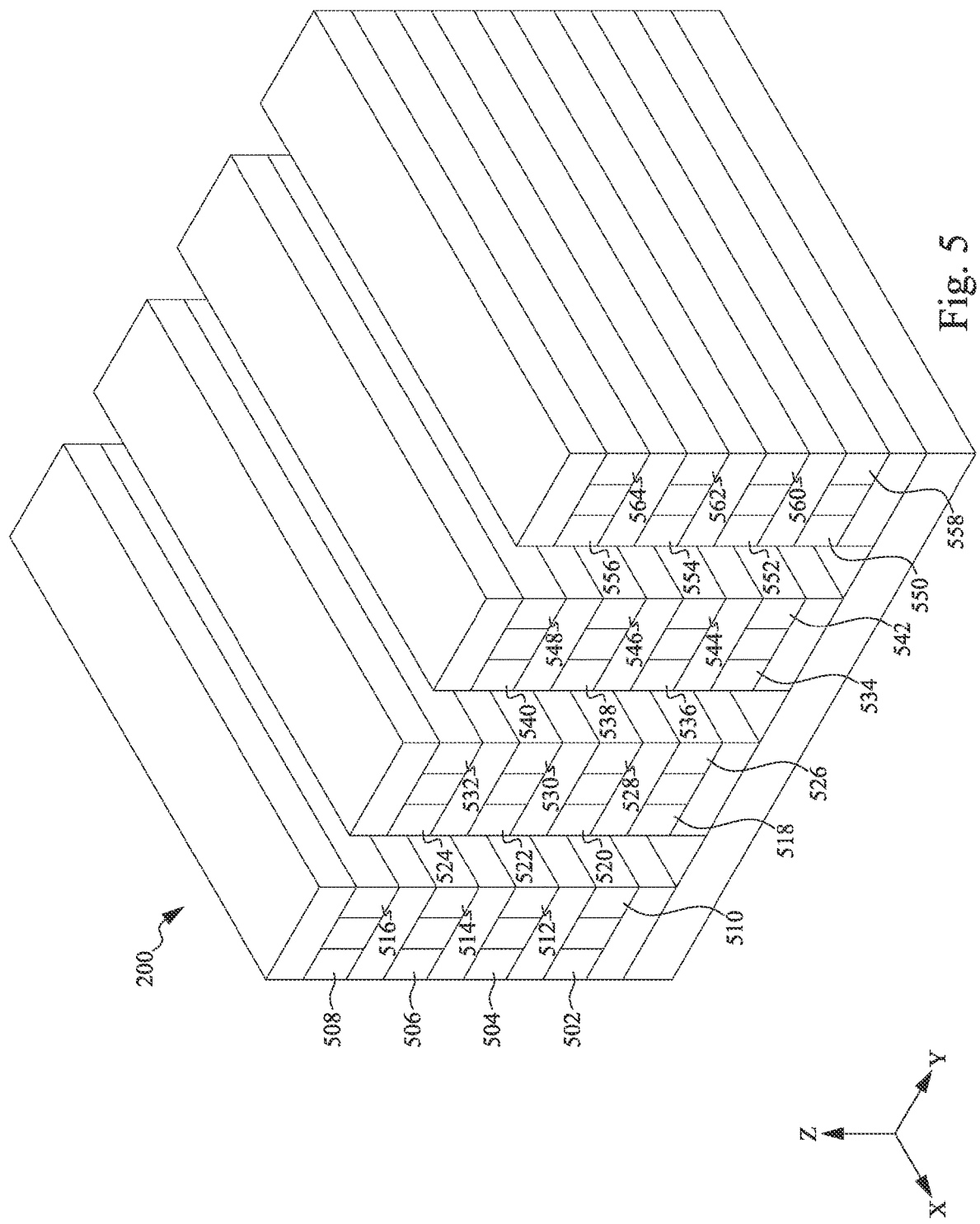

Corresponding to operation 108 of FIG. 1, FIG. 5 is a perspective view of the 3D memory device 200 in which the WLs 502-564 are formed at one of the various stages of fabrication, in accordance with various embodiments.

The WLs 502-564 can be (e.g., conformally) formed by filling the recesses in the fin-like structures 308-314. Each of the WLs 502-564 can comprise a metallic fill layer. The metallic fill layer includes, in some embodiments, at least one metal material selected from the group comprising tungsten, copper, cobalt, ruthenium, titanium, tantalum, or combinations thereof. Other materials are within the scope of the present disclosure. The metallic fill layer can be deposited by a conformal deposition method, which can be, for example, chemical vapor deposition (CVD), atomic layer deposition (ALD), electroless plating, electroplating, or a combination thereof. Other methods of depositing the metallic fill layer are within the scope of the present disclosure.

Figure 6:
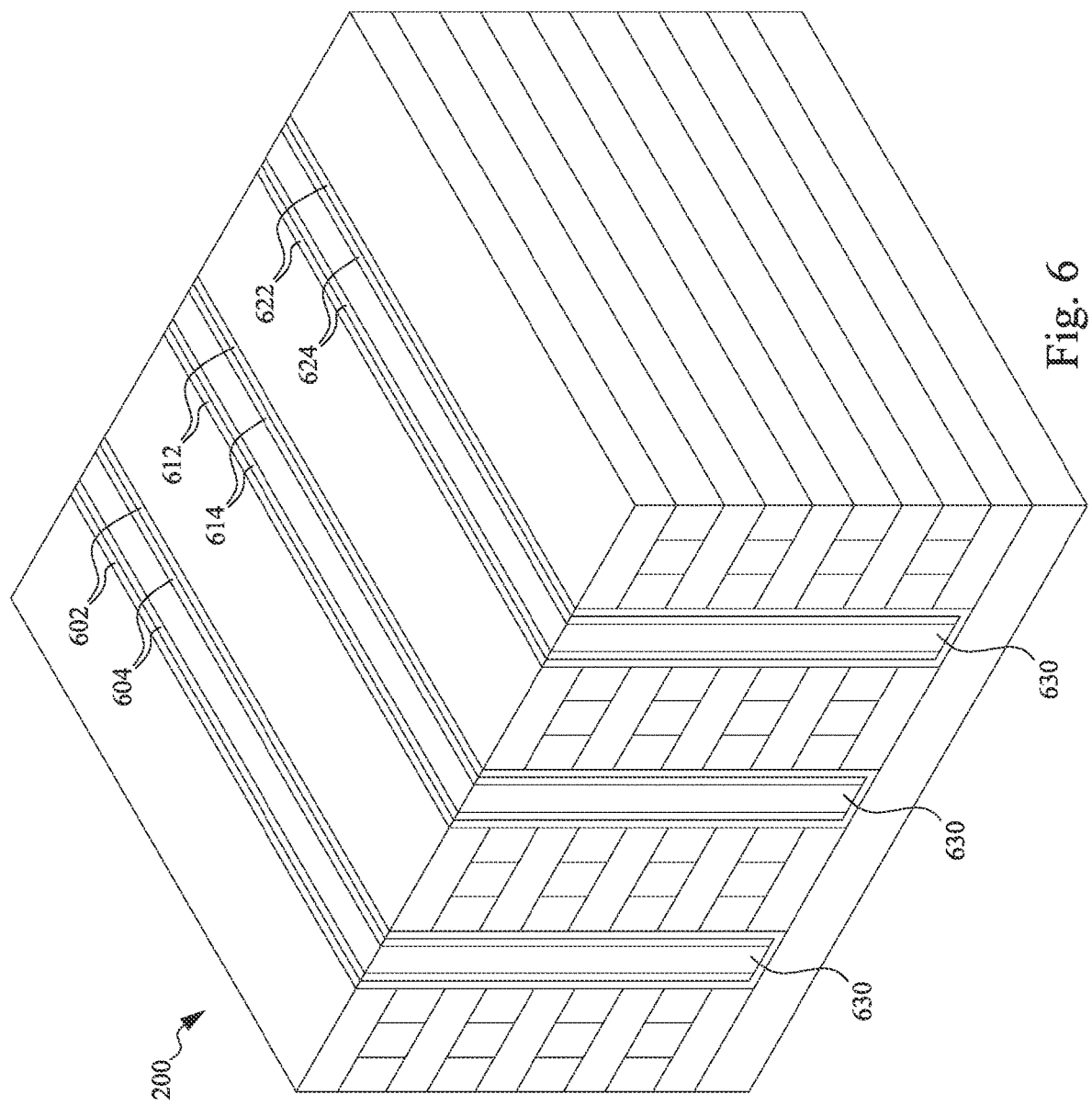

Corresponding to operation 110 of FIG. 1, FIG. 6 is a perspective view of the 3D memory device 200 in which the ferroelectric layers 602, 612, and 622 and channel layers 604, 614, and 624 are formed at one of the various stages of fabrication, in accordance with various embodiments.

In various embodiments, each ferroelectric layer includes two portions, each of which is formed to extend along one of the sidewalls of a corresponding trench. As such, each portion of the ferroelectric layer is in contact with a corresponding number of WLs (through their respective exposed sidewalls). Over each ferroelectric layer, a channel layer also includes two portions that are in contact with the two portions of that ferroelectric layer, respectively. As shown in the illustrated example of FIG. 6, a ferroelectric layer 602 and a channel layer 604 are formed in the trench 302; a ferroelectric layer 612 and a channel layer 614 are formed in the trench 304; and a ferroelectric layer 622 and a channel layer 624 are formed in the trench 306. Taking the ferroelectric layer 602 and the channel layer 604 in the trench 302 as a representative example, the ferroelectric layer 602 that extends along the X direction has two portions, one of which is in contact with the WLs 510-516, and the other of which is in contact with the WLs 518-524.

Further, as each of the ferroelectric layers and channel layers may be conformally formed over the trench as a liner layer (which will be discussed below), at least the ferroelectric layers and channel layers may each present an L-shaped profile, as shown in FIG. 6. Alternatively stated, in addition to the (vertical) portions that contact the respective WLs, each ferroelectric layer can have (lateral) leg portions. In particular, each ferroelectric layer has two leg portions (extending along the Y direction) pointing to each other. Similarly, in addition to the (vertical) portions that contact the respective ferroelectric layer, each channel layer can have (lateral) leg portions. Each channel layer has two leg portions (extending along the Y direction) pointing to each other.

The ferroelectric layers 602, 612, and 622 each include a ferroelectric material. As used herein, a "ferroelectric material" refers to a material that displays a spontaneous electric polarization even when there is no applied electric field and that has the polarization that can be reversed by the application of an external electric field.

In one embodiment, the ferroelectric material includes an orthorhombic metal oxide of which a unit cell has a non-zero permanent electric dipole moment. In one embodiment, the orthorhombic metal oxide includes an orthorhombic hafnium doped zirconium oxide or an orthorhombic hafnium oxide doped with a dopant having an atomic radius that is between 40% smaller than to 15% larger than the atomic radius of hafnium. Other ranges of atomic radii dopant atoms are within the scope of the present disclosure. For example, the orthorhombic metal oxide can include an orthorhombic phase hafnium oxide doped with at least one of silicon, aluminum, yttrium, gadolinium and zirconium. Other materials are within the scope of the present disclosure. The atomic concentration of the dopant atoms (e.g., aluminum atoms) can be in a range from 0.5% to 16.6%. In one embodiment, the atomic concentration of the dopant atoms can be greater than 1.0%, 2.0%, 3.0%, 5.0%, 7.5%, and/or 10%. Alternatively, or additionally, the atomic concentration of the dopant atoms can be less than 15%, 12.5%, 10%, 7.5%, 5.0%. 3.0%, and/or 2.0%. Other values and ranges of atomic concentration of dopant atoms are within the scope of the present disclosure.

The orthorhombic phase of the orthorhombic metal oxide can be a doping-induced non-centrosymmetric crystalline phase that generates a remanent dipole moment upon application and removal of an external electric field. Specifically, polarization of the oxygen atoms with respect to the metal atoms in the orthorhombic metal oxide can induce non-centrosymmetric charge distribution due to the positions (e.g., up or down positions) of the oxygen atoms in the orthorhombic lattice. Other orthorhombic phases are within the scope of the present disclosure.

The ferroelectric material (of the ferroelectric layers 602, 612, and 622) can be deposited over the workpiece as a continuous liner structure, for example, by a conformal deposition method such as atomic layer deposition (ALD) or chemical vapor deposition (CVD). For example, a metal-organic precursor gas and oxygen gas can be alternately or simultaneously flowed into a processing chamber to deposit the ferroelectric material. Other methods of depositing the ferroelectric layers 602, 612, and 622 are within the scope of the present disclosure. The deposited material of the ferroelectric material can be annealed at an elevated temperature that induces formation of the orthorhombic phase in the ferroelectric material. As a non-limiting example, temperature for formation of the orthorhombic metal oxide material in the ferroelectric material can be in a range from 450 degrees Celsius to 850 degrees Celsius, and typically has a window of about 200 degrees Celsius that depends on the composition of the metal oxide. Other temperature values and ranges for depositing the ferroelectric material are within the scope of the present disclosure. After deposition, the ferroelectric material can be annealed at a temperature of 500 to 850 degrees Celsius, such as 500 to 700, such as 550 to 600 degrees Celsius to increase the amount of the orthorhombic phase in the ferroelectric material. Other temperature values and ranges for annealing the ferroelectric material are within the scope of the present disclosure.

The average thickness of the ferroelectric material can be in a range from 5 nm to 30 nm, such as from 6 nm to 12 nm, although lesser and greater average thicknesses can also be employed. Other ranges of average thickness are within the scope of the present disclosure. As used herein, a "thickness" refers to the average thickness unless indicated otherwise. The ferroelectric material can have a thickness variation that is less than 30% from an average thickness. In one embodiment, the thickness variation of the ferroelectric material can be less than 20%, less than 10%, and/or less than 5% of the average thickness of the ferroelectric material. Other ranges of thickness variation are within the scope of the present disclosure.

The channel layers 604, 614, and 624 each include a semiconductor material such as at least one elemental semiconductor material, at least one III-V compound semiconductor material, at least one II-VI compound semiconductor material, at least one organic semiconductor material, or other semiconductor materials. In one embodiment, the semiconductor material includes amorphous silicon or polysilicon. Other materials are within the scope of the present disclosure. In one embodiment, the semiconductor material can have a doping of the first conductivity type. Other conductivity types are within the scope of the present disclosure.

The semiconductor material (of the channel layers 604, 614, and 624) can be formed over the workpiece as a continuous liner structure, for example, by a conformal deposition method such as low-pressure chemical vapor deposition (LPCVD). Other methods of forming the semiconductor material are within the scope of the present disclosure. The thickness of the semiconductor material can be in a range from 3 nm to 30 nm, although lesser and greater thicknesses can also be employed. Other ranges of thickness are within the scope of the present disclosure. In one embodiment, the semiconductor material can have a doping of the first conductivity type. Other conductivity types are within the scope of the present disclosure.

To form the ferroelectric layers 602, 612, and 622 and the channel layers 604, 614, and 624 (as shown in FIG. 6), the above-mentioned ferroelectric material and semiconductor material may be sequentially formed over the workpiece. Each of the ferroelectric material and semiconductor material may be formed as a continuous liner structure over the workpiece. In various embodiments, the trenches 302-306 cannot be completely filled by the ferroelectric material and semiconductor material. Next, an anisotropic etching process may be performed to pattern or otherwise separate the continuous ferroelectric material and semiconductor material. Other methods of patterning are within the scope of the present disclosure. Further, a dielectric fill material 630 can be deposited over the workpiece to fill any unfilled volume within the the trenches 302-306. The dielectric fill material 630 includes a dielectric material such as, for example, silicon oxide, organosilicate glass, an otherwise low-k dielectric material, or combinations thereof. Other materials are within the scope of the present disclosure. The dielectric fill material 630 can be deposited by a conformal deposition method such as low-pressure chemical vapor deposition (LPCVD), or by a self-planarizing deposition process such as spin coating. Other methods of depositing the dielectric fill material 630 are within the scope of the present disclosure. Following the deposition of the dielectric fill material 630, a CMP process may be performed to remove any excess dielectric fill material. Other methods of removing excess dielectric fill material are within the scope of the present disclosure.

Figure 7:
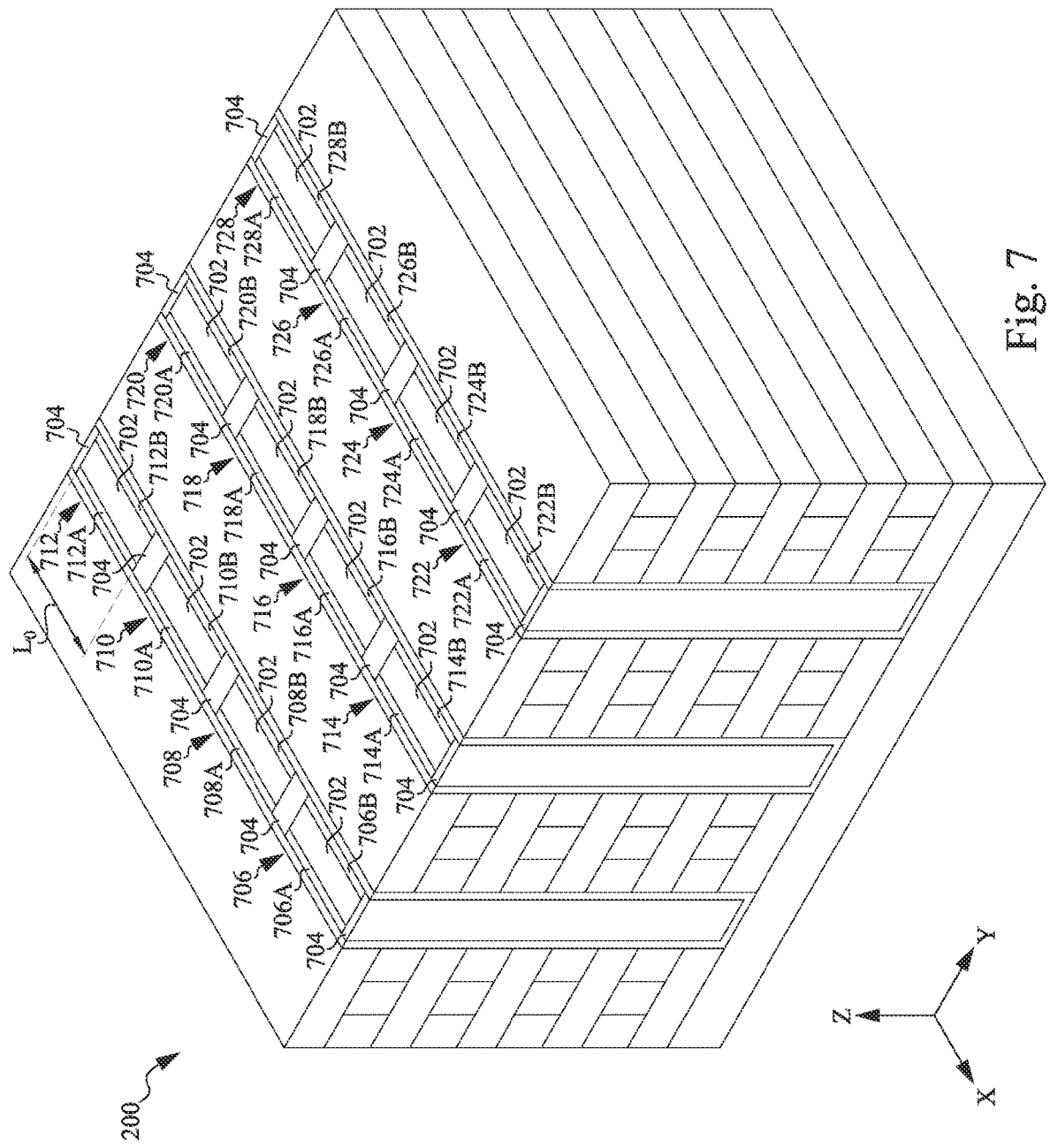

Corresponding to operation 112 of FIG. 1, FIG. 7 is a perspective view of the 3D memory device 200 in which the channel layers 604, 614, and 624 are patterned at one of the various stages of fabrication, in accordance with various embodiments.

The dielectric fill material 630 may be patterned to define initial footprints of memory strings 706 to 728, which will be discussed in further detail below. As shown in FIG. 7, the dielectric fill material 630 is etched to form trench portions in between the footprints for the memory strings 706 to 728.

The remaining portions of the dielectric fill material 630 can include dielectric fill material 702. For example, a first trench portion can be formed between the memory strings 706 and 708. In some embodiments, the dielectric fill material 630 is patterned (or otherwise separated) by, for example, an anisotropic etching process to form various trench portions. Other methods of forming various trench portions are within the scope of the present disclosure.

Next, a dummy dielectric material may be deposited in the trench portions, followed by a CMP process. The dummy dielectric material can be formed by chemical vapor deposition (CVD), plasma enhanced CVD (PECVD), low pressure CVD (LPCVD), or other deposition techniques, which are within the scope of the present disclosure. In various embodiments, the dummy dielectric material includes an insulating material which is a sacrificial material that can be subsequently removed. Non-limiting examples of the dummy dielectric material include silicon nitride, an amorphous semiconductor material (such as amorphous silicon), and a polycrystalline semiconductor material (such as polysilicon). Other materials are within the scope of the present disclosure. In one embodiment, the dummy dielectric material can be spacer material layers that include silicon nitride or a semiconductor material including at least one of silicon or germanium. Other materials are within the scope of the present disclosure.

Next, the channel layers 604, 614, and 624 are each patterned by, for example, an anisotropic etching process to form a number of channel segments 706A-728B. Other methods of patterning the channel layers 604, 614, and 624 are within the scope of the present disclosure. In various embodiments, each of such channel segments may extend along a lateral direction (e.g., the X direction) with a length ($L_0$), which may be configured to define the physical channel length of a memory cell. Other methods of forming the channel segments 706A-728B are within the scope of the present disclosure. In the trench 302, the channel layer 604 is patterned to form a number of channel segments 706A, 706B, 708A, 708B, 710A, 710B, 712A, and 712B; in the trench 304, the channel layer 614 is patterned to form a number of channel segments 714A, 714B, 716A, 716B, 718A, 718B, 720A, and 720B; and in the trench 306, the channel layer 624 is patterned to form a number of channel segments 722A, 722B, 724A, 724B, 726A, 726B, 728A, and 728B. Other methods of forming the channel segments 706A-728B are within the scope of the present disclosure.

Next, the trenches 302-306 (e.g., the first trench portion in between the memory strings 706 and 708) are again filled out by the dielectric fill material 704. The dielectric fill material 704 may be deposited similarly to how the dielectric fill material 630 of FIG. 6 is deposited. Any excess dielectric fill material may be removed similarly to how the excess dielectric fill material described in view of FIG. 6 is removed.

Corresponding to operation 114 of FIG. 1, FIG. 8A is a perspective view of the 3D memory device 200 in which the BLs 804-826 and SLs 828-850 are formed at one of the various stages of fabrication, in accordance with various embodiments. Further, FIG. 8B is a top view of a portion of the 3D memory device 200, corresponding to FIG. 8A.

The dielectric fill material 702 may be patterned to define initial footprints of a number of bit lines (BLs) and source lines (SLs), which will be discussed in further detail below. The patterning generates trench portions in each of the memory strings 706 to 728. The dielectric fill material 702 is patterned (or otherwise separated), for example, by an anisotropic etching process to form various trench portions in each of the memory strings 706 to 728. Other methods of forming various trench portions are within the scope of the present disclosure. The remaining portion of the dielectric fill material 702 (e.g., the dielectric fill material 802) can be configured to electrically isolate a BL and an SL of each memory cell of a certain string of the memory device 200 from each other, which will be discussed in further detail below.

The BLs 804-826 and SLs 828-850 (collectively, drain/source layers/structures) can be formed by filling the trench portions of the memory strings 706 to 728. In some embodiments, a height, width, and length of each of the BLs 804-826 and each of the SLs 828-850 is denoted by $H_1$, $W_1$, and $L_1$. In some embodiments, each of the BLs 804-826 and each of the SLs 828-850 (e.g., $H_1$) vertically extend, along the vertical direction, at least to a lateral plane that intersects the insulating layer 204 below the bottom tier (e.g., the first tier that includes 502, 510, etc.) of the fin-like structures. Each of the BLs 804-826 and each of the SLs 828-850 can comprise a metal material. The metal material can be selected from the group comprising tungsten, copper, cobalt, ruthenium, titanium, tantalum, or combinations thereof. Other materials are within the scope of the present disclosure. The metal material can be deposited by a conformal deposition method, which can be, for example, chemical vapor deposition (CVD), atomic layer deposition (ALD), electroless plating, electroplating, or a combination thereof. Other methods of depositing the metal material are within the scope of the present disclosure.

Corresponding to operation 116 of FIG. 1, FIG. 9A is a perspective view of the 3D memory device 200 in which the BLs 804-826 and SLs 828-850 are expanded to form BLs 904-926 and SLs 928-950, respectively, at one of the various stages of fabrication, in accordance with various embodiments. Further, FIG. 9B is a top view of a portion of the 3D memory device 200, corresponding to FIG. 9A.

In some embodiments, a blanket mask layer is formed over the stack 202. In some embodiments, the blanket mask layer is patterned to form a number of openings exposing respective portions of the stack 202. Each of the openings can be larger than the corresponding BL or SL. For example, a first opening can expose the BL 804 and an end portion of the channel segments 706A and 706B that are adjacent to the BL 804. In some embodiments, the first opening can expose an end portion of the dielectric fill 802 that is adjacent to the BL 804. In some embodiments, the first opening can expose an end portion of the dielectric fill material 704 that is adjacent to the BL 804. In some embodiments, the patterned mask layer covers some portions of the stack 202 (e.g., those not exposed in the openings). The exposed portions of the stack 202 can be etched to form shallow trenches with a height, along the vertical direction, of $H_2$ using an etching process similar to one used to form the trenches 302-306 in FIG. 3. In some embodiments, each of the shallow trenches (e.g., $H_2$) vertically extend, along the vertical direction, not farther than a lateral plane that intersects the insulating layer 204 above the top tier (e.g., the fourth tier that includes 508, 516, etc.) of the fin-like structures.

In some embodiments, the channel segments 952A-954L are formed by etching the end portion of the channel segments 706A-728B exposed by the blanket mask layer. In some embodiments, the dielectric fill 902 is formed by etching the end portion of the dielectric fill material 802 exposed by the blanket mask layer. In some embodiments, the dielectric fill 956 is formed by etching the end portion of the dielectric fill 704 exposed by the blanket mask layer.

The BLs 904-926 and the SLs 928-950 can be formed by replacing end portions of the channel segment (e.g., the dielectric fill) with a conductive material. That is, the BLs 904-926 and the SLs 928-950 can be formed by filling the shallow trenches. Each of the BLs 904-926 and each of the SLs 928-950 can be a nail-like structure comprising a top portion and a bottom portion. The top portion of each of the BLs 904-926 and each of the SLs 928-950 can be the respective filled shallow trench. In some embodiments, a height, width, and length, of the top portion, along the vertical direction, the first lateral direction, and the second lateral direction, respectively, is denoted by $H_2$, $W_2$, and $L_2$.

The bottom portion of each of the BLs 904-926 and each of the SLs 928-950 can be the remaining portion of the respective one of the BLs 804-826 and the SLs 828-850. In some embodiments, a height, width, and length of the bottom portion, along the vertical direction, the first lateral direction, and the second lateral direction, respectively, is $H_1$-$H_2$, $W_1$, and $L_1$. In some embodiments, the top portion extends farther along the first lateral direction than the bottom portion; that is, $W_2 > W_1$. In some embodiments, the top portion extends farther along the second lateral direction than the bottom portion; that is, $L_2 > L_1$ In some embodiments, the bottom portion extends farther along the vertical direction than the top portion; that is, $H_2 < H_1$-$H_2$.

Each of the BLs 904-926 and each of the SLs 928-950 (e.g., the respective filled shallow trench) can comprise a conductive material similar to the conductive material used for the BLs 804-826 the SLs 828-850. The conductive material can be deposited similarly to how the conductive material of the BLs 804-826 and the SLs 828-850 is deposited.

Upon forming the BLs 904-926 and the SLs 928-950, each memory cell of the memory strings 706 through 728 can be accessed through its respective WL, BL, and SL. For example, the memory cell of the 3D memory device 200 can be written (i.e., programmed or erased), and a ferroelectric state of the memory cell can be read (i.e., sensed) in the following manner. Each memory cell can include a region (or portion) of one of the vertically extending ferroelectric layers 602, 612, or 622 located between a selected one of the WLs (e.g., 502-564, as shown in FIG. 5) and a selected one of the vertically extending channel segments 952A-954L. In the following discussion, the memory cell along the memory string 706 at the fourth tier (hereinafter "memory cell 706C") is selected as a representative example for being written and read.

In case the channel segment 952A includes a p-doped semiconductor material, and the minority charge carriers in the p-doped semiconductor channel are electrons, the selected memory cell 706C can be programmed into a programmed (i.e., ON) state that locally decreases a threshold voltage inside the selected channel segment 952A and at a level of the selected WL 516 by applying: (1) a current flow bias voltage across the BL 904 and the SL 928 located adjacent to (e.g., in contact with) the selected channel segment 952A; (2) a selected word line voltage to the selected WL 516, wherein the selected word line voltage is a greater positive voltage with respect to voltages applied to the BL 904 and the SL 928; and (3) an unselected word line voltage that is less positive than the selected word line voltage to each of the unselected WLs (e.g., 510, 512, and 514). In a non-limiting example, the SL 928 can be biased at 0 V, the BL 904 can be biased at 2.0 V, the selected WL 516 can be biased at 5 V, and the unselected WLs can be biased at 2.5 V. Other bias voltage values are within the scope of the present disclosure. This programming step sets the channel threshold voltage adjacent to the programmed memory cell 706C (i.e., adjacent to the selected WL 516) to a relatively low value, such as 0 V. Other threshold voltage values are within the scope of the present disclosure.

Continuing with the same example, the selected memory cell 706C can be programmed into an erased (i.e., OFF) state that increases a threshold voltage inside the selected channel segment 952A and at a level of the selected WL 516 by applying: (1) a current flow bias voltage across the BL 904 and the SL 928 located within the selected channel segment 952A; (2) a selected word line voltage to the selected WL 516, wherein the selected word line voltage is a negative voltage with respect to at least one of voltages applied to the BL 904 and the SL 928; and (3) an unselected word line voltage to unselected WLs that is more positive than the voltages applied to the BL 904 and the SL 928. In a non-limiting example, the SL 928 can be biased at 5 V, the BL 904 can be biased at 5 V, the selected WL 516 can be biased at 0 V, and the unselected WLs can be biased at 7.5 V. Other bias voltage values are within the scope of the present disclosure. This erasing step sets the channel threshold voltage adjacent to the programmed memory cell 706C (i.e., adjacent to the selected WL 516) to a relatively higher value, such as 1 V, which is higher than in the programmed. Other threshold voltage values are within the scope of the present disclosure.

The ON or OFF state of the selected memory cell 706C can be read by applying: (1) a current flow bias voltage across the BL 904 and the SL 928; (2) a selected word line voltage to the selected WL 516, wherein the selected word line voltage is at one of, or is between, voltages applied to the BL 904 and the SL 928; and (3) an unselected word line voltage applied to the unselected WLs that is more positive than the voltages applied to the selected WL 516, the BL 904 and the SL 928. In a non-limiting example, the SL 928 can be biased at 0 V, the BL 904 can be biased at 1 to 2 V, the WL 516 can be biased at 1 to 1.5 V, and the unselected WLs can be biased at 2.5 V (one half of the programming voltage applied to the selected WL 516). Other bias voltage values are within the scope of the present disclosure. This arrangment provides a voltage between the BL 904 and the SL 928 that is greater than the threshold voltage of the channel in the erased memory cells to keep the current flowing in the channel between the BL 904 and the SL 928.

Corresponding to operation 118 of FIG. 1, FIG. 10A is a perspective view of a multi-device-structure 1000 in which multi-device BLs 1004-1026 and multi-device SLs 1028-1050 are formed at one of the various stages of fabrication, in accordance with various embodiments. Further, FIG. 9B is a perspective view of a portion of the multi-device-structure 1000, corresponding to FIG. 10A.

The multi-device BLs 1004-1026 and multi-device SLs 1028-1050 can be formed by placing a second 3D memory device 1002 over the 3D memory device 900. In some embodiments, the second 3D memory device 1002 aligned with (e.g., disposed in alignment with, centered with, centrally disposed over, etc.), in a plane along the first and second lateral directions, the 3D memory device 1002. In some embodiments, the second 3D memory device 1002 is disposed at an offset from (e.g., not centered with, misaligned with, disposed in misalignment with, etc.), in a plane along the first and second lateral directions, the 3D memory device 1002. The second 3D memory device 1002 can be formed in accordance with the operations 102-116. In some embodiments, the second 3D memory device 1002 is formed over the 3D memory device 200, while in other embodiments, the second 3D memory device 1002 is formed separately and, after being formed, is placed over the memory device 200.

Figure 11B:
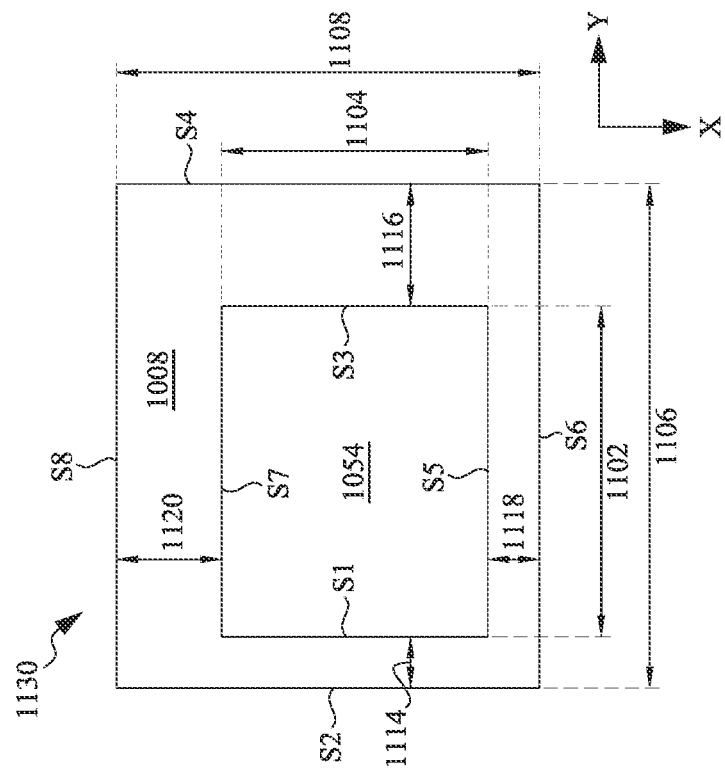

As shown in FIGS. 10A-10B, the BLs 1004-1026 and multi-device SLs 1028-1050 have a square-shaped configuration, although other configurations of multi-device BLs and SLs are within the scope of the disclosure. The square-shaped configuration is described in detail with respect to FIGS. 11A-11B and other configurations are described in detail with respect to FIGS. 12A-16B.

The FIG. 10B illustrates a perspective view of the multi-device BL 1020 that comprises a BL 1052 of the second 3D memory device 1002 disposed over the BL 920 of the 3D memory device 200. Although the multi-device BL 1020 is shown as an example, each of the multi-device BLs 1020-1026 and each of the multi-device SLs 1028-1050 are similar. In some embodiments, the BL 920 includes the top portion 1008 (e.g., similar to the top portion described with respect to FIG. 9B) and the bottom portion 1006 (e.g., similar to the bottom portion described with respect to FIG. 9B). In some embodiments, the BL 1052 includes a top portion 1056 that is similar to the top portion 1008 of the BL 920 and a bottom portion 1014 that is similar to the bottom portion 1006 of the BL 920.

In some embodiments, the BL 1052 (e.g., the bottom portion 1054) is aligned with the BL 920 (e.g., the top portion 1008), in a plane along the first and second lateral directions, while in other embodiments, the BL 1052 (e.g., the bottom portion 1054) is disposed at an offset from the BL 920 (e.g., the top portion 1008), in a plane along the first and second lateral directions. In some embodiments, the bottom portion 1054 is disposed (e.g., fully/completely or substantially disposed) over the top portion 1008 irrespective of whether the BL 1052 is misaligned with the BL 920. Advantageously, a contact resistance between the 3D memory device 200 and the second 3D memory device 1002 that is misaligned with the 3D memory device 200 can be lower due to the bottom portion 1054 being fully or substantially disposed over the top portion 1008.

Figure 11A:
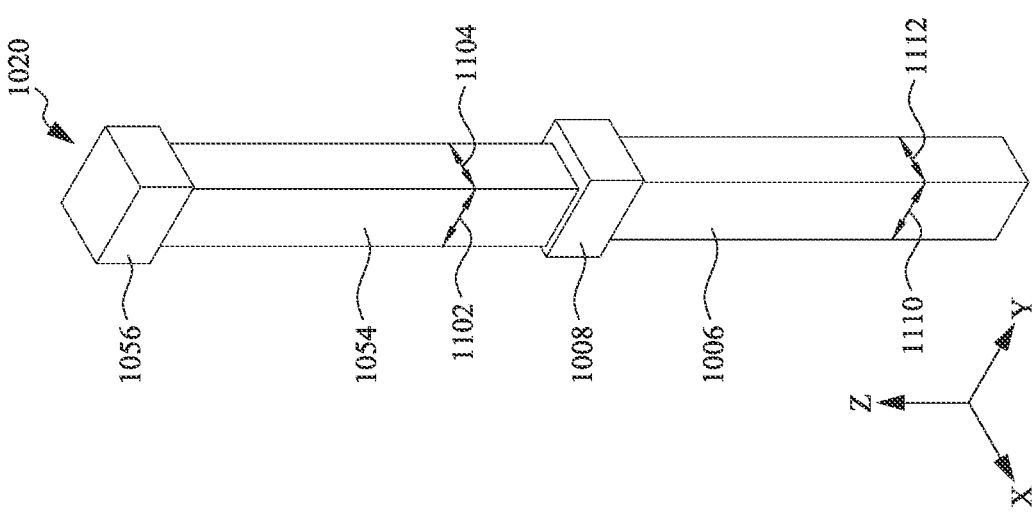

FIGS. 11A-16B illustrate perspective views and top views of various configurations of multi-device BLs and SLs in FIGS. 10A-10B 1020. FIG. 11A illustrates a perspective view of the square-shaped multi-device BL 1020. Further, FIG. 11B is a top view of a portion 1130 of the square-shaped multi-device BL 1020, corresponding to FIG. 11A.

The square-shaped multi-device BL 1020 comprises a bottom portion 1006 of a first device (e.g., the 3D memory device 200), a top portion 1008 of the first device, a bottom portion 1054 of a second device (e.g., the second 3D memory device 1002), and a top portion 1056 of the second device. The bottom portion 1006 may include a width 1110 along a first lateral direction and a length 1112 along a second lateral direction. The width 1110 can be similar to the width $W_1$ of FIG. 8B and the length 1112 can be similar to the length $L_1$ of FIG. 8B. In some embodiments, the width 1110 is equal to the length 1112. The width 1106 can be similar to the width $W_2$ of FIG. 9B and the length 1108 can be similar to the length $L_2$ of FIG. 9B. The top portion 1008 may include a width 1106 along the first lateral direction and a length 1108 along the second lateral direction. The top portion 1008 may have a square-based shape. That is, in some embodiments, the width 1106 is equal to the length 1108.

The bottom portion 1054 may include a width 1102 along a first lateral direction and a length 1104 along a second lateral direction. In some embodiments, the width 1102 may be equal to the width 1110 and the length 1104 may be equal to the length 1112. The top portion 1056 may be similar to the top portion 1008 (e.g., includes a width equal to the width 1102 and a length equal to the length 1108). In some embodiments, each of the top portions 1008 and 1056 extends farther along the first lateral direction than each of the bottom portions 1006 and 1054. In some embodiments, each of the top portions 1008 and 1056 extends farther along the second lateral direction than each of the bottom portions 1006 and 1054.

The bottom portion 1054 may be fully disposed over the top portion 1008. In some embodiments, a sidewall S1 of the bottom portion 1054 is spaced from a sidewall S2 of the top portion 1008 by a spacing (e.g., distance) 1114. In some embodiments, a sidewall S3 of the bottom portion 1054 is spaced from a sidewall S4 of the top portion 1008 by a spacing 1116. In some embodiments, a sidewall S5 of the bottom portion 1054 is spaced from a sidewall S6 of the top portion 1008 by a spacing 1118. In some embodiments, a sidewall S7 of the bottom portion 1054 is spaced from a sidewall S8 of the top portion 1008 by a spacing 1120.

In some embodiments, the bottom portion 1054 is aligned with the top portion 1008 in a plane along the first and second lateral directions. That is, in some embodiments, the spacings 1114 and 1118 are equal to the spacings 1116 and 1120, respectively. In some embodiments, the bottom portion 1054 is offset with the top portion 1008 in a plane along the first and second lateral directions. That is, in some embodiments, at least one of the spacings 1114 or 1118 is different (e.g., greater or less) than the spacings 1118 or 1120, respectively. Similar spacings and similar relationships among the spacings may exist with respect to the top portion 1008 being disposed over the bottom portion 1006 and with respect to the top portion 1056 being disposed over the bottom portion 1054.

Figure 12B:
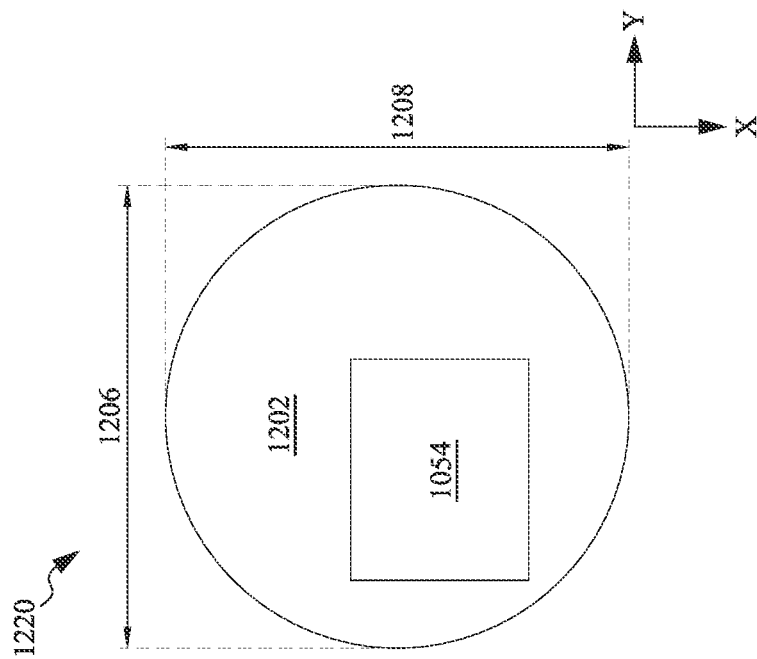
Figure 12A:
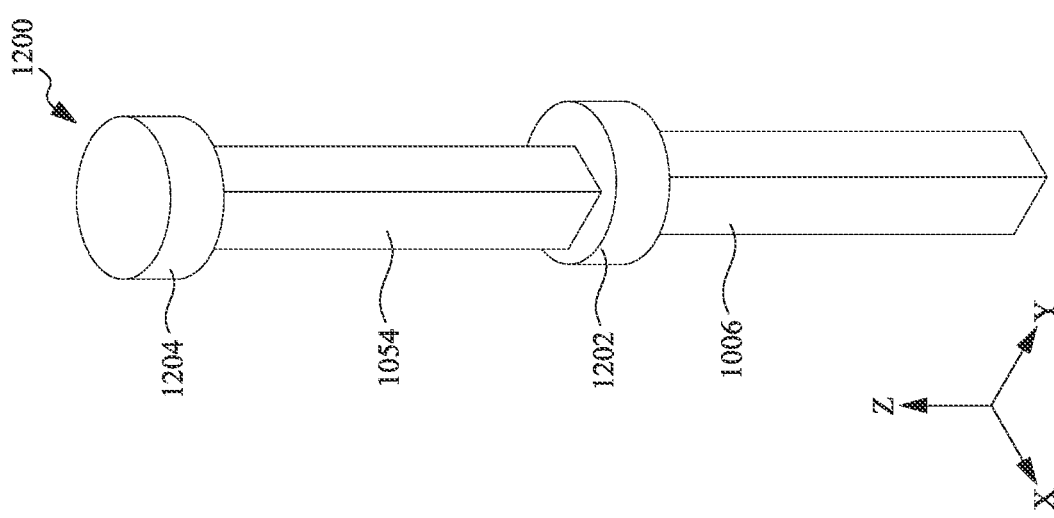

FIG. 12A illustrates a perspective view of the circular-shaped multi-device BL 1200. Further, FIG. 12B is a top view of a portion 1220 of the circular-shaped multi-device BL 1200, corresponding to FIG. 12A. In some embodiments, the circular-shaped multi-device BL 1200 is similar to the square-shaped multi-device BL 1020 except for the differences described herein.

The circular-shaped multi-device BL 1200 comprises the bottom portion 1006 of a first device (e.g., the 3D memory device 200) as shown in FIG. 11A, a top portion 1202 of the first device, the bottom portion 1054 of a second device (e.g., the second 3D memory device 1002) as shown in FIG. 11A, and a top portion 1204 of the second device. The top portion 1202 may have a curvature-based shape. The top portion 1202 may include a maximum width (e.g., diameter) 1206 along the first lateral direction and a maximum width 1208 along the second lateral direction. In some embodiments, the maximum width 1206 is equal to the maximum width 1208. In some embodiments, the top portion 1204 is similar to the top portion 1202.

FIG. 13A illustrates a perspective view of the rectangular-shaped multi-device BL 1300. Further, FIG. 13B is a top view of a portion 1320 of the rectangular-shaped multi-device BL 1300, corresponding to FIG. 13A. In some embodiments, the rectangular-shaped multi-device BL 1300 is similar to the square-shaped multi-device BL 1020 except for the differences described herein.

The rectangular-shaped multi-device BL 1300 comprises the bottom portion 1006 of a first device (e.g., the 3D memory device 200) as shown in FIG. 11A, a top portion 1302 of the first device, the bottom portion 1054 of a second device (e.g., the second 3D memory device 1002) as shown in FIG. 11A, and a top portion 1304 of the second device.

The top portion 1302 may have a rectangular-based shape. The top portion 1302 may include a width 1308 along the first lateral direction and a length 1306 along the second lateral direction. In some embodiments, the width 1308 is different than the length 1306. In some embodiments, the top portion 1304 is similar to the top portion 1302.

Figure 14B:
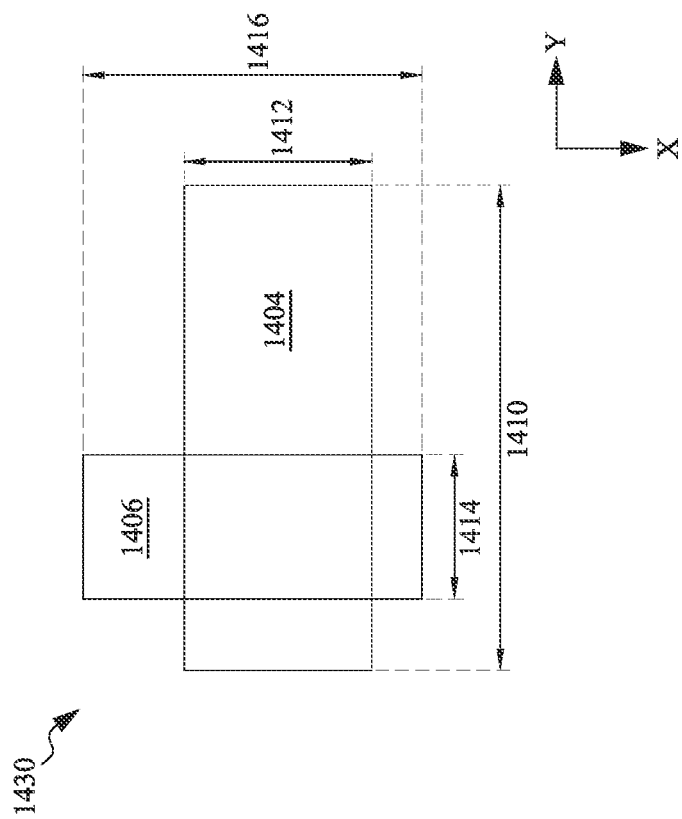
Figure 14A:
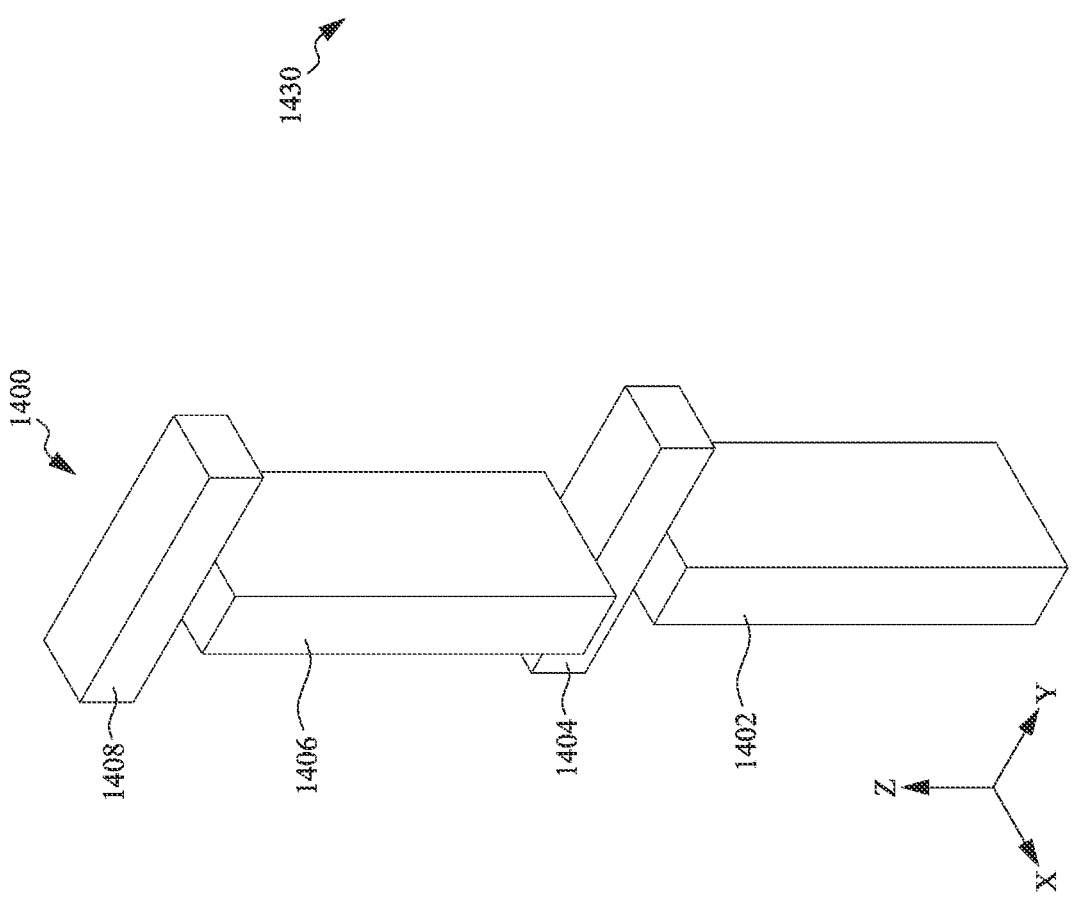

FIG. 14A illustrates a perspective view of another rectangular-shaped multi-device BL 1400. Further, FIG. 14B is a top view of a portion 1430 of the rectangular-shaped multi-device BL 1400, corresponding to FIG. 14A. In some embodiments, the rectangular-shaped multi-device BL 1400 is similar to the rectangular-shaped multi-device BL 1300 except for the differences described herein.

The rectangular-shaped multi-device BL 1400 comprises a bottom portion 1402 of a first device (e.g., the 3D memory device 200), a top portion 1404 of the first device, a bottom portion 1406 of a second device (e.g., the second 3D memory device 1002), and a top portion 1408 of the second device. The top portion 1404 may include a width 1410 along the first lateral direction and a length 1412 along the second lateral direction. In some embodiments, the width 1410 is greater than the length 1412. In some embodiments, the top portion 1408 is similar to the top portion 1404. The bottom portion 1406 may include a width 1414 along the first lateral direction and a length 1416 along the second lateral direction. In some embodiments, the width 1414 is less than the length 1416. In some embodiments, the top portion 1408 is similar to the top portion 1404.

In some embodiments, each of the top portions 1404 and 1408 extends farther along the first lateral direction than each of the bottom portions 1402 and 1406. In some embodiments, each of the bottom portions 1402 and 1406 extends farther along the second lateral direction than each of the top portions 1404 and 1408. The bottom portion 1406 may be (e.g., only) partially disposed over the top portion 1404.

FIG. 15A illustrates a perspective view of yet another rectangular-shaped multi-device BL 1500. Further, FIG. 15B is a top view of a portion 1530 of the rectangular-shaped multi-device BL 1500, corresponding to FIG. 15A. In some embodiments, the rectangular-shaped multi-device BL 1500 is similar to the rectangular-shaped multi-device BL 1300 except for the differences described herein.

The rectangular-shaped multi-device BL 1500 comprises a bottom portion 1502 of a first device (e.g., the 3D memory device 200), a top portion 1504 of the first device, a bottom portion 1506 of a second device (e.g., the second 3D memory device 1002), and a top portion 1508 of the second device. The top portion 1504 may include a width 1510 along the first lateral direction and a length 1512 along the second lateral direction. In some embodiments, the width 1510 is less than the length 1512. In some embodiments, the top portion 1508 is similar to the top portion 1504. The bottom portion 1406 may include a width 1514 along the first lateral direction and a length 1516 along the second lateral direction. In some embodiments, the width 1514 is greater than the length 1516. In some embodiments, the top portion 1508 is similar to the top portion 1504.

In some embodiments, each of the bottom portions 1502 and 1506 extends farther along the first lateral direction than each of the top portions 1504 and 1508. In some embodiments, each of the top portions 1504 and 1508 extends farther along the second lateral direction than each of the bottom portions 1502 and 1506. The bottom portion 1506 may be (e.g., only) partially disposed over the top portion 1504.

Figure 16B:
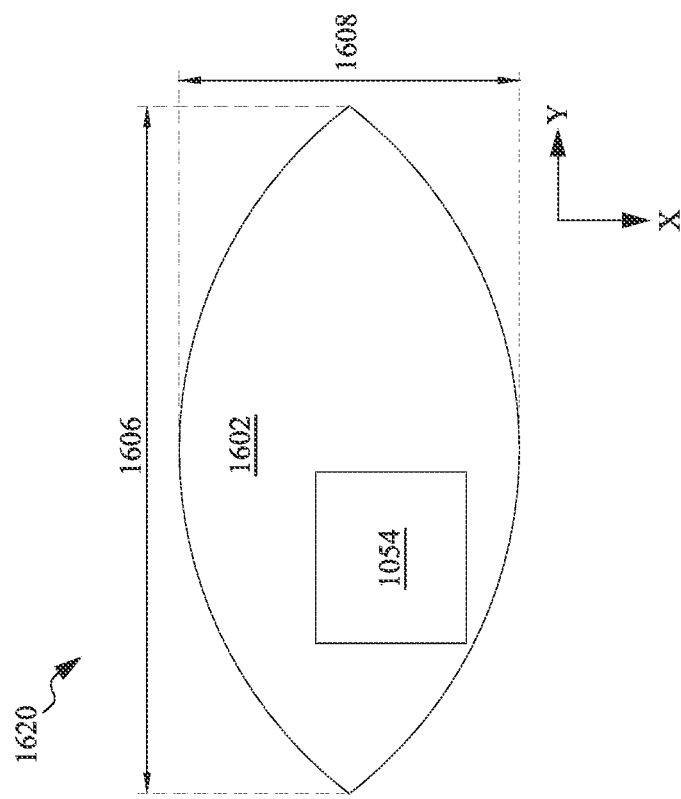
Figure 16A:
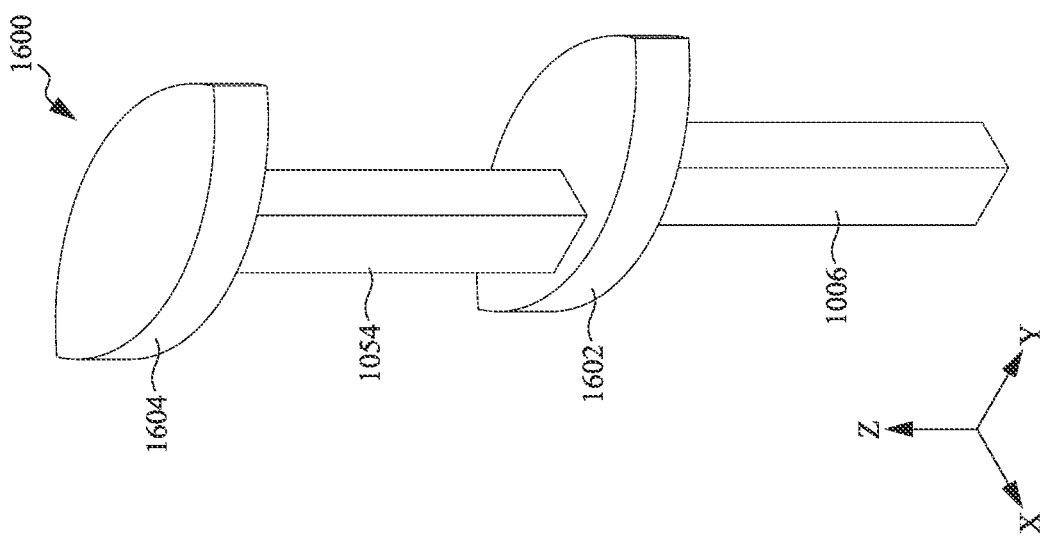

FIG. 16A illustrates a perspective view of the oval-shaped multi-device BL 1600. Further, FIG. 16B is a top view of a portion 1620 of the oval-shaped multi-device BL 1600, corresponding to FIG. 16A. In some embodiments, the oval-shaped multi-device BL 1600 is similar to the circular-shaped multi-device BL 1200 except for the differences described herein.

The oval-shaped multi-device BL 1200 comprises the bottom portion 1006 of a first device (e.g., the 3D memory device 200) as shown in FIG. 11A, a top portion 1602 of the first device, the bottom portion 1054 of a second device (e.g., the second 3D memory device 1002) as shown in FIG. 11A, and a top portion 1604 of the second device. The top portion 1602 may include a maximum width (e.g., diameter) 1606 along the first lateral direction and a maximum width 1608 along the second lateral direction. In some embodiments, the maximum width 1606 is different (e.g., greater or less) than the maximum width 1608. In some embodiments, the top portion 1604 is similar to the top portion 1602.

Figure 17:
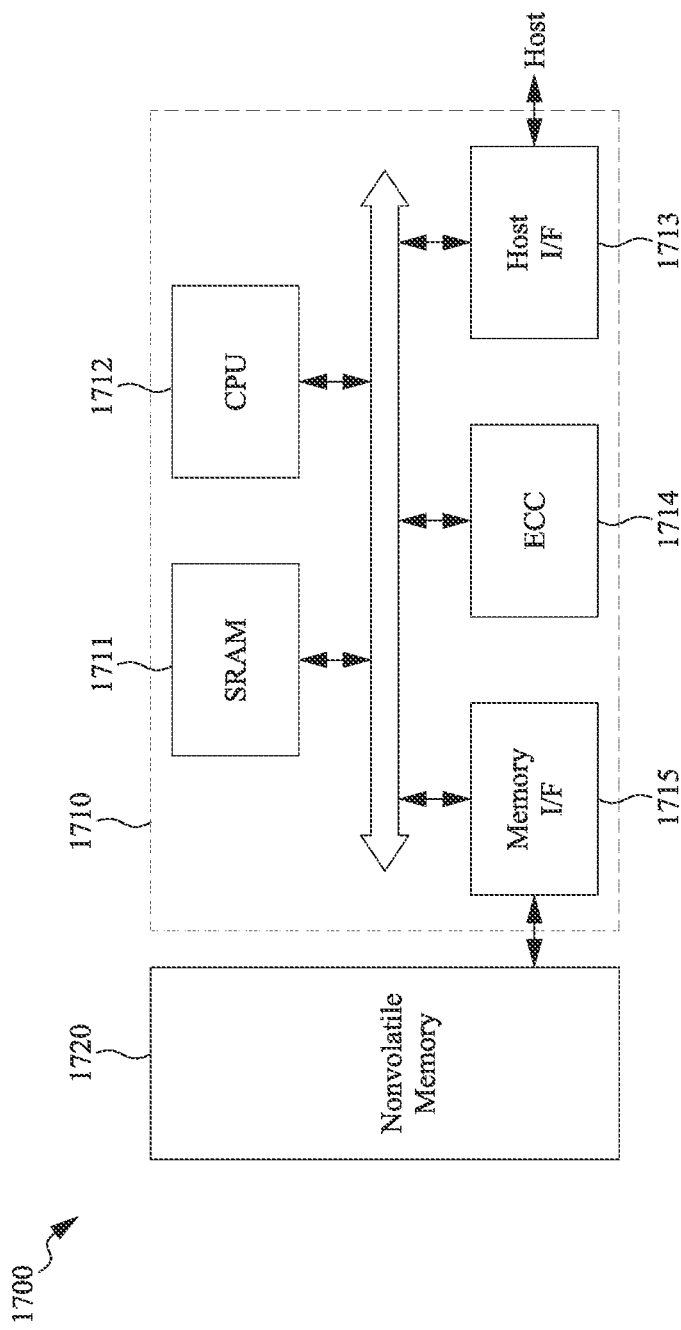
FIG. 17 illustrates a block diagram of an example configuration of a memory system that includes the three-dimensional memory device, as disclosed herein, in accordance with some embodiments.

FIG. 17 is a block diagram showing the configuration of a memory system, according to various embodiment of the present disclosure. As shown, a memory system 1700 according to various embodiments of the present disclosure includes a non-volatile memory device 1720 and a memory controller 1710.

The non-volatile memory device 1720 may include the 3D memory device, as disclosed herein. In addition, the non-volatile memory device 1720 may be a multi-chip package composed of a number of ferroelectric memory chips.

The memory controller 1710 is configured to control the non-volatile memory device 1720. The memory controller 1710 may include SRAM 1711, a central processing unit (CPU) 1712, a host interface (I/F) 1713, an error-correcting code (ECC) 1714, and a memory interface 1715. The SRAM 1711 functions as an operation memory of the CPU 1712. The CPU 1712 performs the general control operation for data exchange of the memory controller 1710. The host interface 1713 includes a data exchange protocol of a host being coupled to the memory system 1700. In addition, the ECC 1714 may detect and correct errors included in a data read from the non-volatile memory device 1720. The memory interface 1715 interfaces with the non-volatile memory device 1720. The memory controller 1710 may further store code data to interface with the host.

In some aspects of the present disclosure, a memory device is disclosed. In some aspects, the memory device includes a first memory array including: a plurality of memory strings spaced from each other along a first lateral direction and a second lateral direction, each of the plurality of memory strings including a plurality of memory cells arranged along a vertical direction; and a plurality of first conductive structures extending along the vertical direction; wherein each of the plurality of first conductive structures includes a first portion and a second portion; wherein the first portion extends across the plurality of memory cells of a corresponding pair of the plurality of memory strings along the vertical direction, and the second portion is disposed over the first portion along the vertical direction; and wherein the second portion extends farther than the first portion along at least one of the first or second lateral direction.

In some aspects, the second portion extends farther than the first portion along the first lateral direction. In some aspects, the second portion extends farther than the first portion along the second lateral direction. In some aspects, the first portion extends farther than the second portion along the first lateral direction. In some aspects, the first portion extends farther than the second portion along the second lateral direction.

In some aspects, the second portion has a square-based shape along the first and second lateral directions. In some aspects, the second portion has a rectangular-based shape along the first and second lateral directions. In some aspects, the second portion has a curvature-based shape along the first and second lateral directions with a maximum width along the at least one of the first or second lateral direction that is greater than a width of the first portion along the same direction. In some aspects, the second portion has a second maximum width along a second one of the first or second lateral direction that is less than the maximum width.

In some aspects, the memory device further includes a second memory array disposed over the first memory array, the second memory array including a plurality of second memory strings spaced from each other along the first lateral direction and the second lateral direction, each of the plurality of second memory strings including a plurality of second memory cells arranged along the vertical direction; and a plurality of second conductive structures extending along the vertical direction; wherein each of the plurality of second conductive structures comprises a third portion and a fourth portion; wherein the third portion is disposed over the second portion of a corresponding one of the plurality of first conductive structures and extends across the plurality of second memory cells of a corresponding pair of the plurality of second memory strings along the vertical direction; wherein the fourth portion is disposed over the third portion along the vertical direction; and wherein the fourth portion extends farther than the third portion along at least one of the first or second lateral direction.

In some aspects of the present disclosure, a memory device is disclosed. In some aspects, the memory device includes a first memory array including: a plurality of memory strings spaced from each other along a first lateral direction and a second lateral direction, each of the plurality of memory strings including a plurality of memory cells arranged along a vertical direction; and a plurality of first conductive structures extending along the vertical direction; wherein each of the plurality of first conductive structures includes a first portion and a second portion; and wherein the first portion extends across the plurality of memory cells of a corresponding pair of the plurality of memory strings along the vertical direction, and the second portion is disposed over the first portion along the vertical direction; and a second memory array disposed over the first memory array, the second memory array including: a plurality of second memory strings spaced from each other along the first lateral direction and the second lateral direction, each of the plurality of second memory strings including a plurality of second memory cells arranged along the vertical direction; and a plurality of second conductive structures extending along the vertical direction; wherein each of the plurality of second conductive structures includes a third portion disposed over the second portion of a corresponding one of the plurality of first conductive structures; wherein the third portion extends across the plurality of second memory cells of a corresponding pair of the plurality of second memory strings along the vertical direction; and wherein the second portion extends farther than the third portion along at least one of the first or second lateral direction.

In some aspects, the second portion extends farther than the third portion along the first lateral direction. In some aspects, the second portion extends farther than the third portion along the second lateral direction. In some aspects, the third portion extends farther than the second portion along the first lateral direction. In some aspects, the third portion extends farther than the second portion along the second lateral direction.

In some aspects, the second portion has a square-based shape along the first and second lateral directions. In some aspects, the second portion has a rectangular-based shape along the first and second lateral directions. In some aspects, the second portion of the first conductive structure has a curvature-based shape along the first and second lateral directions with a maximum width along the at least one of the first or second lateral direction that is greater than a width of the third portion along the same direction.

In some aspects, a method for fabricating a memory device is disclosed. In some aspects, the method includes forming a plurality of first conductive structures separated from each other along a vertical direction, wherein each of the plurality of first conductive structures extends along a first lateral direction; forming a memory layer extending along the vertical direction to electrically couple to the plurality of first conductive structures; forming a channel segment to extend along the memory layer along the vertical direction; forming a second conductive structure and a third conductive structure extending along the vertical direction, wherein the second and third conductive structures are coupled to the channel segment and disposed opposite the channel segment from the memory layer; and expanding the second conductive structure and third conductive structure along a second lateral direction perpendicular to the first lateral direction. In some aspects, the method includes replacing end portions of the channel segment with a conductive material.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A memory device, comprising:
    a first memory array comprising:
        a plurality of memory strings spaced from each other along a first lateral direction and a second lateral direction, each of the plurality of memory strings comprising a plurality of memory cells arranged along a vertical direction; and
        a plurality of first conductive structures extending along the vertical direction;
        wherein each of the plurality of first conductive structures comprises a first portion and a second portion;
        wherein the first portion extends across the plurality of memory cells of a corresponding pair of the plurality of memory strings along the vertical direction, and the second portion is disposed over the first portion along the vertical direction; and
        wherein the second portion extends farther than the first portion along at least one of the first or second lateral direction.

2. The memory device of claim 1, wherein the second portion extends farther than the first portion along the first lateral direction.

3. The memory device of claim 1, wherein the second portion extends farther than the first portion along the second lateral direction.

4. The memory device of claim 1, wherein the first portion extends farther than the second portion along the first lateral direction.

5. The memory device of claim 1, wherein the first portion extends farther than the second portion along the second lateral direction.

6. The memory device of claim 1, wherein the second portion has a square-based shape along the first and second lateral directions.

7. The memory device of claim 1, wherein the second portion has a rectangular-based shape along the first and second lateral directions.

8. The memory device of claim 1, wherein the second portion has a curvature-based shape along the first and second lateral directions with a maximum width along the at least one of the first or second lateral direction that is greater than a width of the first portion along the same direction.

9. The memory device of claim 1, wherein the second portion has a second maximum width along a second one of the first or second lateral direction that is less than the maximum width.

10. The memory device of claim 1, further comprising:
a second memory array disposed over the first memory array, the second memory array comprising:
a plurality of second memory strings spaced from each other along the first lateral direction and the second lateral direction, each of the plurality of second memory strings comprising a plurality of second memory cells arranged along the vertical direction; and
a plurality of second conductive structures extending along the vertical direction;
wherein each of the plurality of second conductive structures comprises a third portion and a fourth portion;
wherein the third portion is disposed over the second portion of a corresponding one of the plurality of first conductive structures and extends across the plurality of second memory cells of a corresponding pair of the plurality of second memory strings along the vertical direction;
wherein the fourth portion is disposed over the third portion along the vertical direction; and
wherein the fourth portion extends farther than the third portion along at least one of the first or second lateral direction.

11. A memory device, comprising:
a first memory array comprising:
a plurality of memory strings spaced from each other along a first lateral direction and a second lateral direction, each of the plurality of memory strings comprising a plurality of memory cells arranged along a vertical direction; and
a plurality of first conductive structures extending along the vertical direction;
wherein each of the plurality of first conductive structures comprises a first portion and a second portion; and
wherein the first portion extends across the plurality of memory cells of a corresponding pair of the plurality of memory strings along the vertical direction, and the second portion is disposed over the first portion along the vertical direction; and
a second memory array disposed over the first memory array, the second memory array comprising:
a plurality of second memory strings spaced from each other along the first lateral direction and the second lateral direction, each of the plurality of second memory strings comprising a plurality of second memory cells arranged along the vertical direction; and
a plurality of second conductive structures extending along the vertical direction;
wherein each of the plurality of second conductive structures comprises a third portion disposed over the second portion of a corresponding one of the plurality of first conductive structures;
wherein the third portion extends across the plurality of second memory cells of a corresponding pair of the plurality of second memory strings along the vertical direction; and
wherein the second portion extends farther than the third portion along at least one of the first or second lateral direction.

12. The memory device of claim 11, wherein the second portion extends farther than the third portion along the first lateral direction.

13. The memory device of claim 11, wherein the second portion extends farther than the third portion along the second lateral direction.

14. The memory device of claim 11, wherein the third portion extends farther than the second portion along the first lateral direction.

15. The memory device of claim 11, wherein the third portion extends farther than the second portion along the second lateral direction.

16. The memory device of claim 11, wherein the second portion has a square-based shape along the first and second lateral directions.

17. The memory device of claim 11, wherein the second portion has a rectangular-based shape along the first and second lateral directions.

18. The memory device of claim 11, wherein the second portion of the first conductive structure has a curvature-based shape along the first and second lateral directions with a maximum width along the at least one of the first or second lateral direction that is greater than a width of the third portion along the same direction.

19. A memory device, comprising:
a first memory array comprising:
a plurality of memory strings spaced from each other along a first lateral direction and a second lateral direction, each of the plurality of memory strings comprising a plurality of memory cells arranged along a vertical direction; and
a plurality of first conductive structures operatively coupled to the plurality of memory strings, respectively, and extending along the vertical direction;
wherein each of the plurality of conductive structures essentially consists of a first portion and a second portion directly connected to each other;
wherein the first portion extends across the plurality of memory cells of a corresponding pair of the plurality of memory strings along the vertical direction, and the second portion is disposed over the first portion along the vertical direction; and wherein the second portion extends farther than the first portion along at least one of the first or second lateral direction.

20. The memory device of claim 19, wherein the plurality of first conductive structures comprise a plurality of pairs, each of which includes a source line and a bit line for a corresponding pair of the plurality of memory strings.

\* \* \* \* \*